(12) United States Patent
Gladstone et al.

(10) Patent No.: US 8,909,501 B2
(45) Date of Patent: Dec. 9, 2014

(54) METHOD AND APPARATUS FOR OPTIMIZATION OF FLOOR COVERING AND SYSTEM FOR USER CONFIGURATION AND REAL TIME PRICING INFORMATION

(75) Inventors: Richard Gladstone, Houston, TX (US); Adam Sills, Houston, TX (US); John McPherson, Houston, TX (US)

(73) Assignee: ePlan Partners, Ltd., Houston, TX (US)

( * ) Notice: Subject to any disclaimer, the term of this patent is extended or adjusted under 35 U.S.C. 154(b) by 380 days.

(21) Appl. No.: 13/283,729

(22) Filed: Oct. 28, 2011

(65) Prior Publication Data

US 2012/0109596 A1 May 3, 2012

Related U.S. Application Data

(60) Provisional application No. 61/409,585, filed on Nov. 3, 2010.

(51) Int. Cl.
*G06F 17/50* (2006.01)

(52) U.S. Cl.
CPC .................................. *G06F 17/5004* (2013.01)
USPC ............................................................. 703/1

(58) Field of Classification Search
None
See application file for complete search history.

(56) References Cited

U.S. PATENT DOCUMENTS

| 5,191,542 A * | 3/1993 | Murofushi .................... 364/491 |
| 6,314,334 B1 | 11/2001 | Berlin et al. |
| 6,625,937 B1 * | 9/2003 | Parker et al. ................... 52/79.7 |
| 6,968,298 B2 | 11/2005 | Lohmann et al. |
| 7,031,787 B2 | 4/2006 | Kalthoff et al. |
| 2002/0065635 A1 | 5/2002 | Lei et al. |
| 2002/0123941 A1 | 9/2002 | Donahue et al. |
| 2002/0152001 A1 | 10/2002 | Knipp et al. |
| 2004/0073492 A1 | 4/2004 | Griffin |
| 2005/0289018 A1 | 12/2005 | Sullivan et al. |
| 2006/0111878 A1 | 5/2006 | Pendyala et al. |
| 2006/0282357 A1 | 12/2006 | Southern et al. |
| 2007/0061774 A1 | 3/2007 | Chan et al. |
| 2008/0126023 A1 * | 5/2008 | Hoguet ............................ 703/1 |
| 2009/0216661 A1 | 8/2009 | Warner |
| 2010/0114738 A1 | 5/2010 | Chung |

* cited by examiner

*Primary Examiner* — Omar Fernandez Rivas
*Assistant Examiner* — Bernard E Cothran

(57) ABSTRACT

A method and system for optimizing surface coverings having user input representative of a construction project, floor plans representative of the project including optional configurations of the plans, user input for selection from a plurality of the plans and options and creating data points representative of one of the plans, merging the plan and options into a set of data points representative of a final plan set, determining room surface selections from user input, deriving contiguity data from the surface areas representative of the surface selections; and optimizing price of floor materials for selected criteria based on pre-determined rules. The system and method weights traffic flow based on room configurations and determines optimal cuts of materials to minimize seams. Further, the system packs the cut materials optimally to fit standard sheet material such as carpet and vinyl.

14 Claims, 57 Drawing Sheets

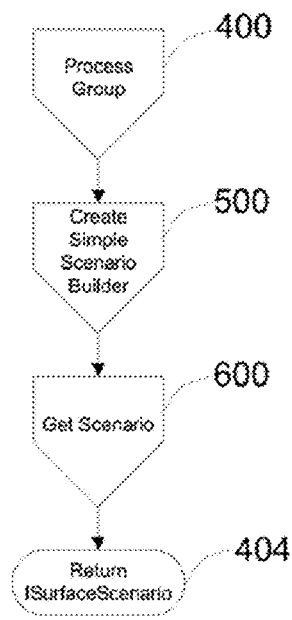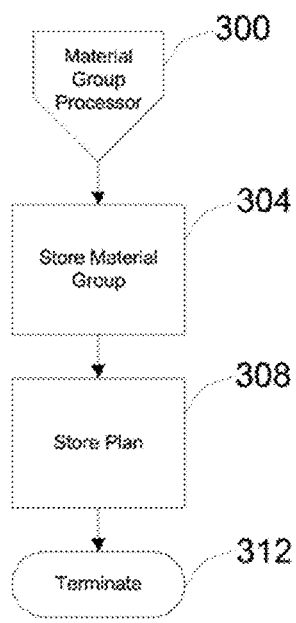
FIG. 2E

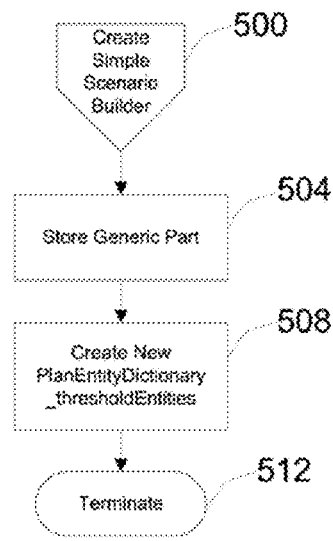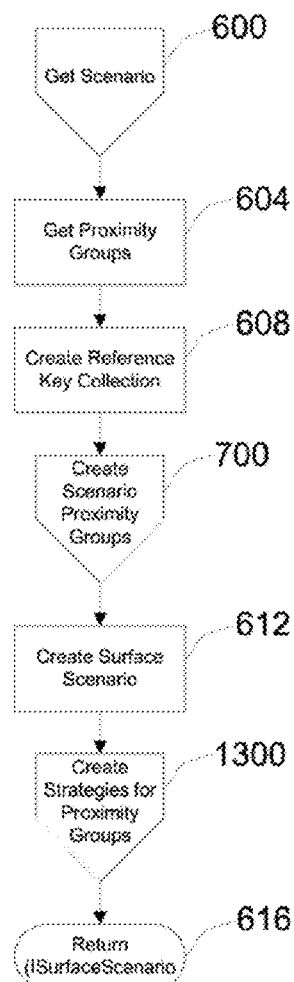
FIG. 2F

FIG. 9

METHOD AND APPARATUS FOR OPTIMIZATION OF FLOOR COVERING AND SYSTEM FOR USER CONFIGURATION AND REAL TIME PRICING INFORMATION

CROSS REFERENCE TO RELATED APPLICATIONS

This application is based on provisional application Ser. No. 61/409,585 filed on Nov. 3, 2010 which is incorporated as if fully set forth herein.

STATEMENT REGARDING FEDERALLY SPONSORED RESEARCH OR DEVELOPMENT

Not Applicable

DESCRIPTION OF ATTACHED APPENDIX

Not Applicable

BACKGROUND OF THE INVENTION

This invention relates generally to the field of floor coverings and more specifically to a Method and Apparatus For Optimization of Floor Covering And System For User Configuration and Real Time Pricing Information.

BRIEF SUMMARY OF THE INVENTION

The primary advantage of the invention is to provide a system for optimizing material use in floor covering.

Another advantage of the invention is to provide a method for an end user to configure floor coverings for a dwelling and obtain real time pricing information.

Another advantage of the invention is to allow for reconfiguration of house plans by end users and the ability to obtain pricing information of floor coverings in real time.

Another advantage of the invention is to provide an innovative system of optimization that includes packing disparate pieces of floor material onto a roll of floor covering stock.

Other objects and advantages of the present invention will become apparent from the following descriptions, taken in connection with the accompanying drawings, wherein, by way of illustration and example, an embodiment of the present invention is disclosed.

BRIEF DESCRIPTION OF THE DRAWINGS

The drawings constitute a part of this specification and include exemplary embodiments to the invention, which may be embodied in various forms. It is to be understood that in some instances various aspects of the invention may be shown exaggerated or enlarged to facilitate an understanding of the invention.

FIG. 9 is a diagrammatic drawing showing a product attribute search attribute selector according to a preferred embodiment of the invention

DETAILED DESCRIPTION OF THE PREFERRED EMBODIMENTS

Figure 1A:
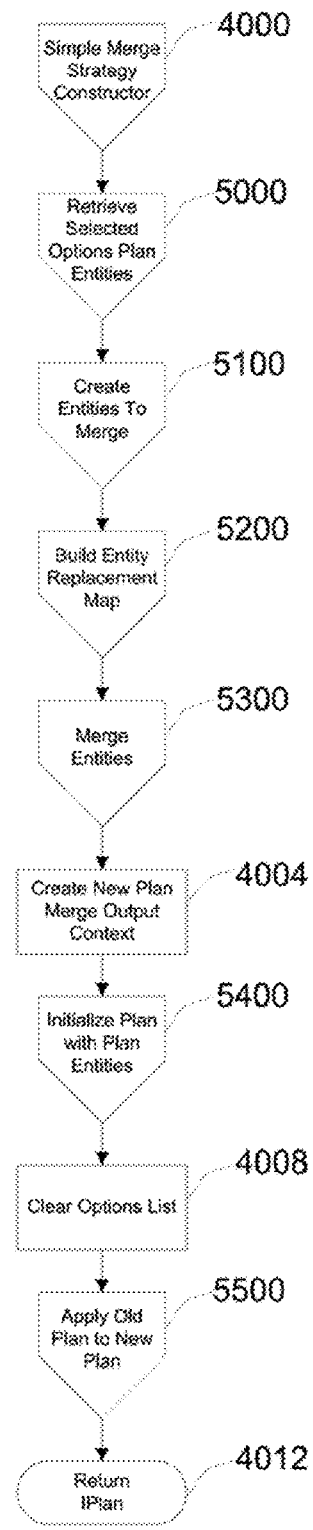
FIG. 1A through 1H is a flow chart showing the operation of a software program to integrate floor plan options into a final floor plan for calculation of covering material according to a preferred embodiment of the invention.

Detailed descriptions of the preferred embodiment are provided herein. It is to be understood, however, that the present invention may be embodied in various forms. Therefore, specific details disclosed herein are not to be interpreted as limiting, but rather as a basis for later filed claims and as a representative basis for teaching one skilled in the art to employ the present invention in virtually any appropriately detailed system, structure or manner.

The Options Estimator and Concierge is an integrated suite of software applications and computer system designed to provide an environment in which buyers of new homes are empowered to (a) configure their home plan, including optional areas that fit their lifestyle (b) select products for installation in that home and (c) receive a true and accurate price for those products, estimated and quoted in real time.

The Options Estimator is used to configure various room/area options offered by builders. A standard plan and its options are configured once according to a preferred embodiment of the invention.

Concierge is the vehicle for selecting the plans created in the Options Estimator and applying the desired options to create homebuyer plans tailored to the consumer's requirements. A plan created in the present invention can be consumed repeatedly by any number of homebuyers, each time resulting in a separate homebuyer plan that models the home they purchase, including all selected optional areas and features.

BACKGROUND

Typical production homebuilders offer a limited selection of standard plans. The dimensions of the plan's areas are normally fixed; dimensional changes are usually discouraged because such changes require the plan to be re-engineered, which is a costly and time consuming process. Homebuyers, however, demand choices above and beyond the standard plan offered by the builder. To accommodate a homebuyer's need to tailor plans to their individual lifestyle, builders often times offer a limited number of pre-configured, fixed architectural options. An Architectural option can add space to a home, as in the case of a Bonus Room. Or it can reconfigure an existing space; such as transforming a Living Room open to adjacent Family and Dining Rooms into an enclosed Study, accessible only through its double door entrance.

Homebuilders would benefit from a system that enables standard plans and their architectural options to be modeled electronically for consideration by the homebuyer. Such a system would enable homebuyers to visualize the flow of their prospective homes. Of course, it would be theoretically possible to draw every permutation of standard plan/architectural option combination and present each as a separate homebuyer choice. Unfortunately, as the number of architectural options grows in ordinal fashion (1, 2, 3, 4, 5, etc), the number of combinations grows in factorial increments (1, 2, 6, 24, 120, etc). For example, given a plan with just 6 available architectural options, 720 different combinations are possible. Therefore, it is impractical to attempt to pre-draw all possible combinations for presentation to the homebuyer.

Homebuyers also demand fast response to their inquiries regarding product pricing for their home. Unfortunately, some products do not lend themselves to immediate pricing. Professional estimators are employed to estimate quantities for roll goods such as carpet by hand. To provide accurate estimates, the architectural option and product choices must be known. Human error is common and turnaround time for estimates can be days or weeks.

Homebuilders would also benefit from a system that empowers product choices to be made for various areas of the home electronically, and to present final prices to the homebuyer interactively in real time. Prior to the present invention, no system has existed that meets the challenges of (a) modeling the plan with its architectural option selections (b) empowering the homebuyer to select products for that plan (c) automatically estimating the material requirements for the plan in real time and (d) pricing those products directly to the homebuyer.

The present invention offers a system that overcomes the challenges outlined above. It uniquely provides the following features:

End User Input: Model a standard plan and its architectural options in such a manner that an end user can select them in any allowable combination.

Plan Merge: Assemble the selected standard plan and architectural options into a separate, integral homebuyer plan that visually and geometrically models the home as purchased.

Product Selection: Provide a user interface that allows the homebuyer to select products for the areas of the home modeled by the homebuyer plan.

Surface Area Creation: Respond to the user's product selections by performing calculations on the homebuyer plan and its user-selected products to create geometric area/product groups for which efficient material estimating can be performed.

Optimization: Perform estimating calculations on the generated surface areas, using the selected products' attributes and area geometries, to determine the scenario that results in most efficient, aesthetically acceptable material layout.

Pricing: Apply unit prices to each of the area/product groups bills of material to arrive at a final homebuyer price and present that price to the homebuyer.

End User Input

Concierge presents the builder standard plan list in a comprehensive and easy-to-use interface that empowers the user to select their chosen plan as shown in Table 1. The left hand column of the Table presents choices for a builder, a community and a particular home plan available for that builder in that community. On the right hand side, are the chosen fields that designate a specific builder, ABC Homes, for a location, Pleasant Valley Subdivision, and a base home plan called Georgian Contemporary.

TABLE 1

Plan Selection User Interface

| Builder | ABC Homes |
| Community | Pleasant Valley Subdivision |
| Plan | Georgian Contemporary |

Figure 5A:
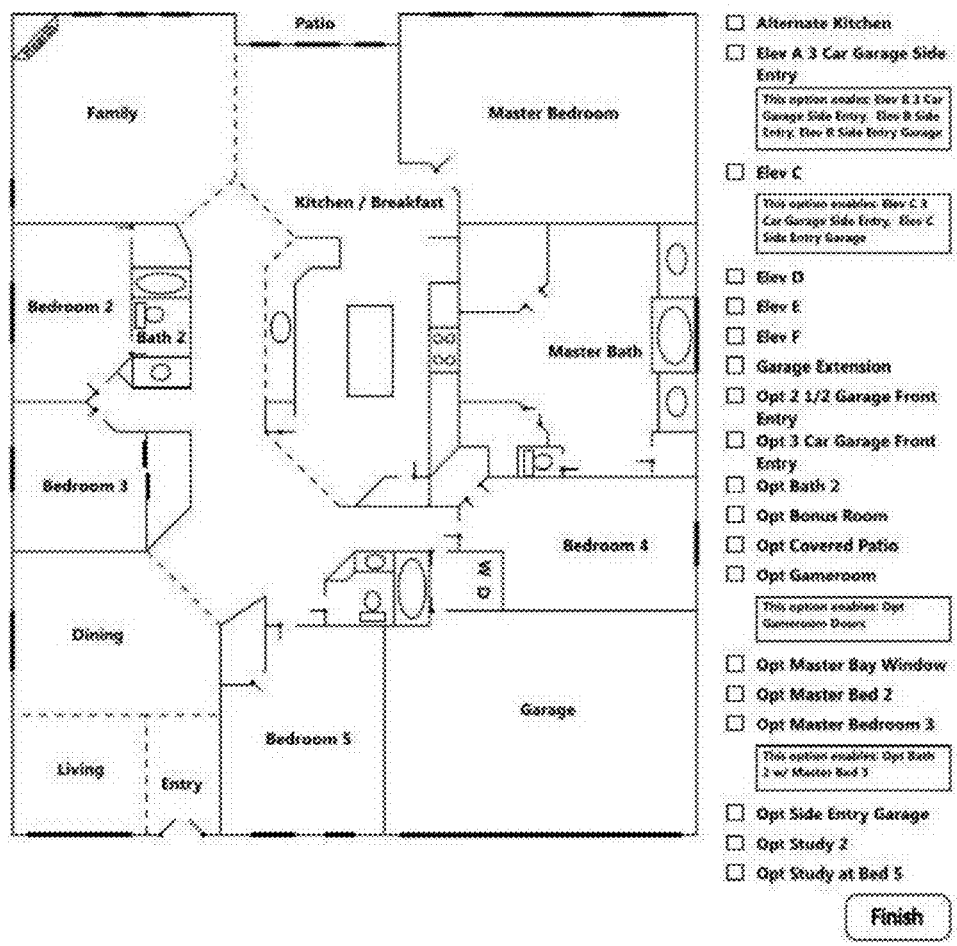
FIG. 5A through 5C is a diagrammatic drawings showing an architectural option selection user Interface on according to a preferred embodiment of the invention
Figure 5B:
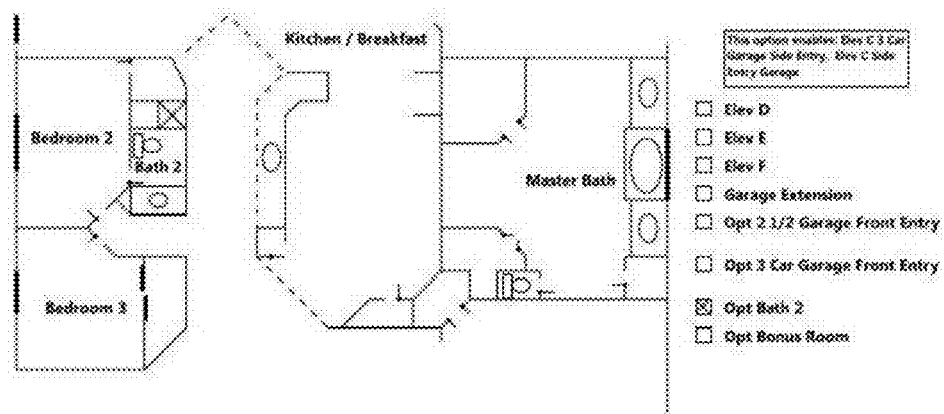

The present invention empowers the end user to select pre-configured architectural options as well. FIG. 5A shows a user input screen of a preferred embodiment that allows user to select architectural options such as a bathtub in place of a shower. FIG. 5B shows a portion of the screen from FIG. 5A after the user has selected an optional second bath, having selected "Opt Bath 2." How a Plan is Configured:

The Options Estimator user traces over an electronic form of the builder's original blue print, including details such as walls, doors, openings transitions and fixtures.

Areas of the plan for which architectural options exist are defined with the Architectural Region tool.

A copy of the plan's elements' inside the Architectural Region is made for every option. For example, if the builder offers 3 variations of a Living Room, 3 sets of the Living Room region's plan elements are copied off to an unused area of the plan as architectural options. An extra copy of the region is also created automatically to represent the region itself as an available option. The plan elements of the copied options are revised so that their dimensions match those offered by the builder.

The Options Estimator maintains the spatial relationship between the Architectural Region's plan elements and those of each of its copies in the form of an x,y coordinate system offset value.

Multiple copies of a Region automatically form Mutually Exclusive dependency relationships. The Mutually Exclusive behavior dictates that when any of the copies of the Region is selected in Concierge, any other previously selected copy is automatically deselected.

The Options Estimator user may dictate other dependency relationships between options that cannot be automatically determined by the program. For example, an optional elevation may consist of a region drawn around the first and second floors separately. In this scenario, the user sets a Mandatory dependency relationship between the region's options so that the elevation can be modeled as a single unit, resulting in both the first and second floor being selected together in Concierge. The Options Estimator provides support for other dependency relationships as well. An exclusionary relationship dictates that option A cannot be selected in Concierge once option B has been selected. A Contingent relationship dictates that option B can be selected only when option A has been selected.

Each option is named so that it can be easily selected in Concierge, as illustrated above.

Plan Merge

The present invention merges the user-selected architectural option plan elements with those of the standard plan to create a new, separate homebuyer plan.

How the present invention merges a plan's selected elements:

The collection of plan elements that will participate in the merge is identified. This collection consists of those elements that exist either in the plan outside of any architectural region, or inside the user-selected architectural option associated with each region. All other plan elements are discarded.

Figure 5C:
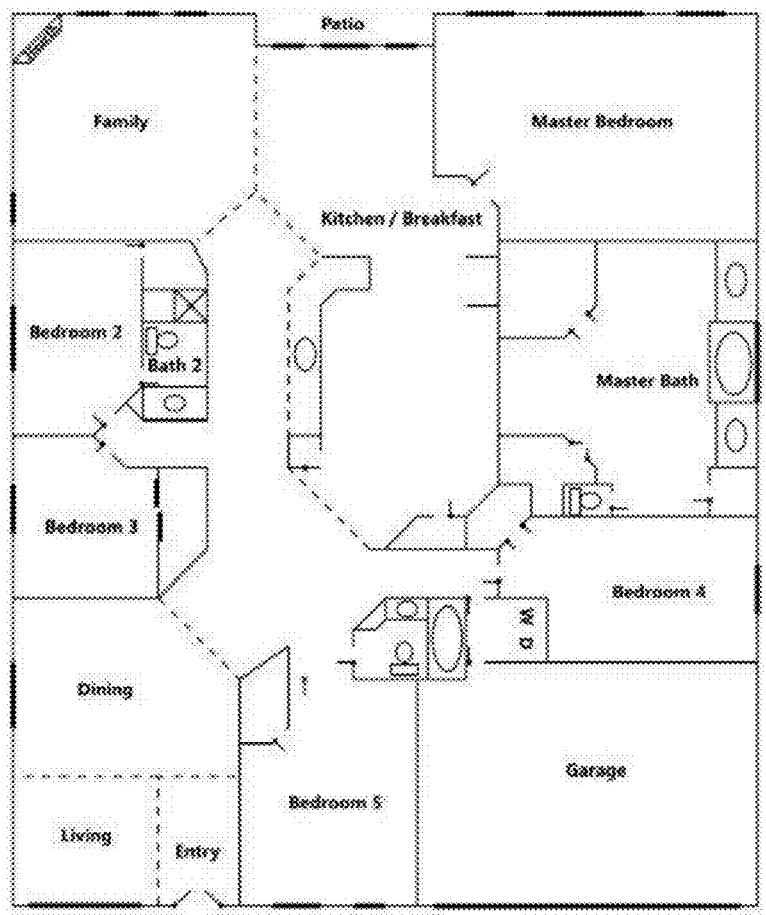

A list of conflicting pairs of plan elements within the collection is created. The list contains those elements that exist both on the base plan as well as within one of the selected options. A Replacement Entity Map is constructed that will be used to dictate which plan elements will replace those on the standard plan. The conflicting elements are merged using a series of merge strategies, each of which is specialized to manage a specific type of plan element. A new plan is constructed from the merged elements. The plan is cleaned up to remove any unneeded vestiges of the original plan, including references to the original plan's architectural options. The resulting newly merged plan represents the homebuyer's choice of standard plan and its desired architectural option selections. One such plan presented to the user is shown in FIG. 5C after merging the standard plan with the optional second bath.

Product Selection

The present invention empowers the homebuyer to make product selections for their home.

Figure 6:
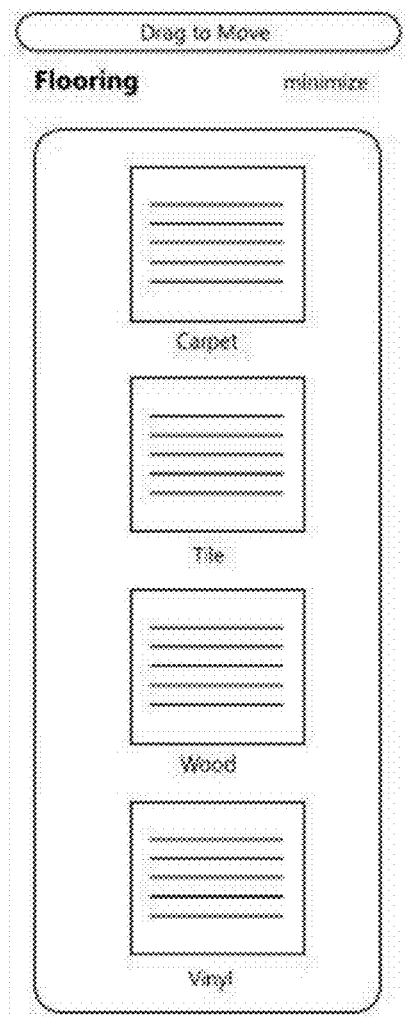
FIG. 6 is a diagrammatic drawing showing a product selector interface according to a preferred embodiment of the invention

How A Product Selection is Made in Concierge:

For a given application (Flooring, Walls, Counter Tops, Window Coverings, etc.), the builder-allowable list of products is presented to the user, as shown in FIG. 6.

Figure 7:
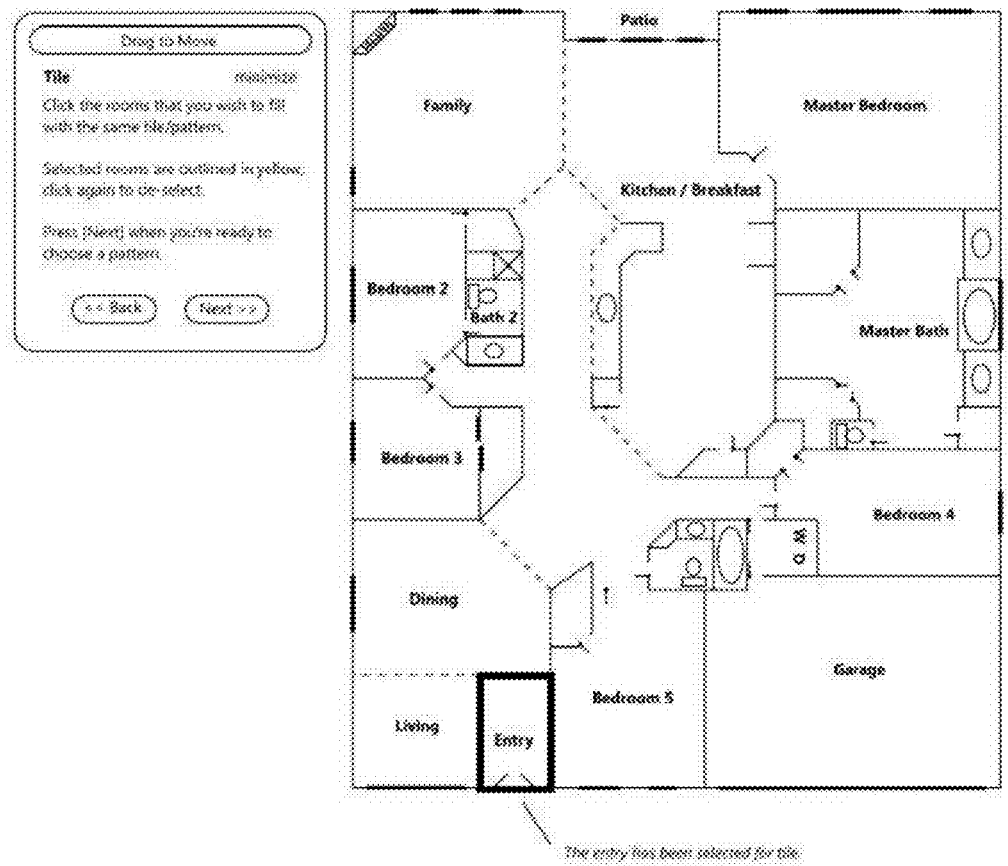
FIG. 7 is a diagrammatic drawing showing a user interface for tile according to a preferred embodiment of the invention

The plan is displayed, as shown in FIG. 7. In a preferred embodiment, the plan may be color-coded for each area's default or selected products.

The user selects the desired area(s) on the floor plan, as shown in FIG. 7 for example, the areas identified as kitchen/breakfast, Master Bath, and Bath 2 may be highlighted and filled with tile after selection by the user. In a preferred embodiment, the selected areas may be highlighted by a different color on screen for easier identification.

Figure 8:
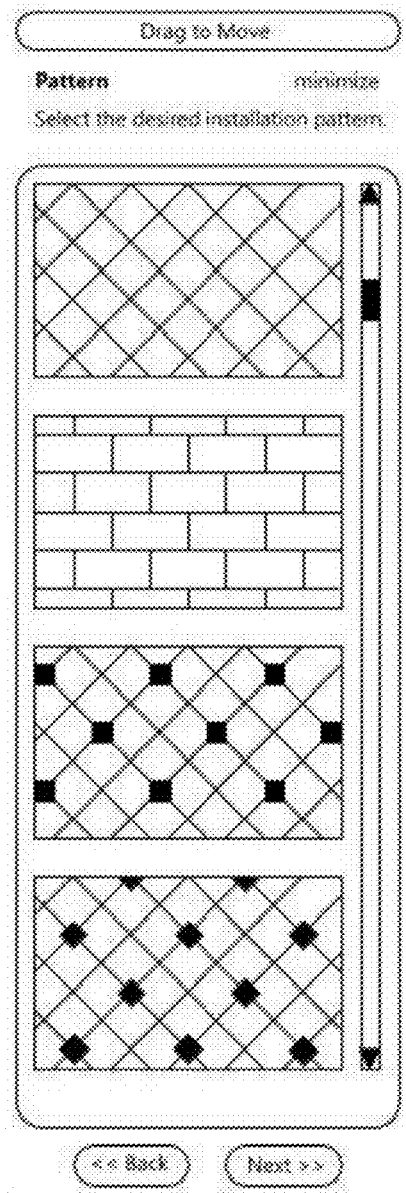
FIG. 8 is a diagrammatic drawing showing a pattern selector for tile according to a preferred embodiment of the invention

For applications for which various installation patterns are offered, the allowable list of patterns may be displayed, as shown in FIG. 8. FIG. 8 shows a input selection screen that may be scrolled and advanced to show a variety of tile installation patterns. From this template, the user may select a particular pattern and fill in the plan accordingly.

Figure 9:
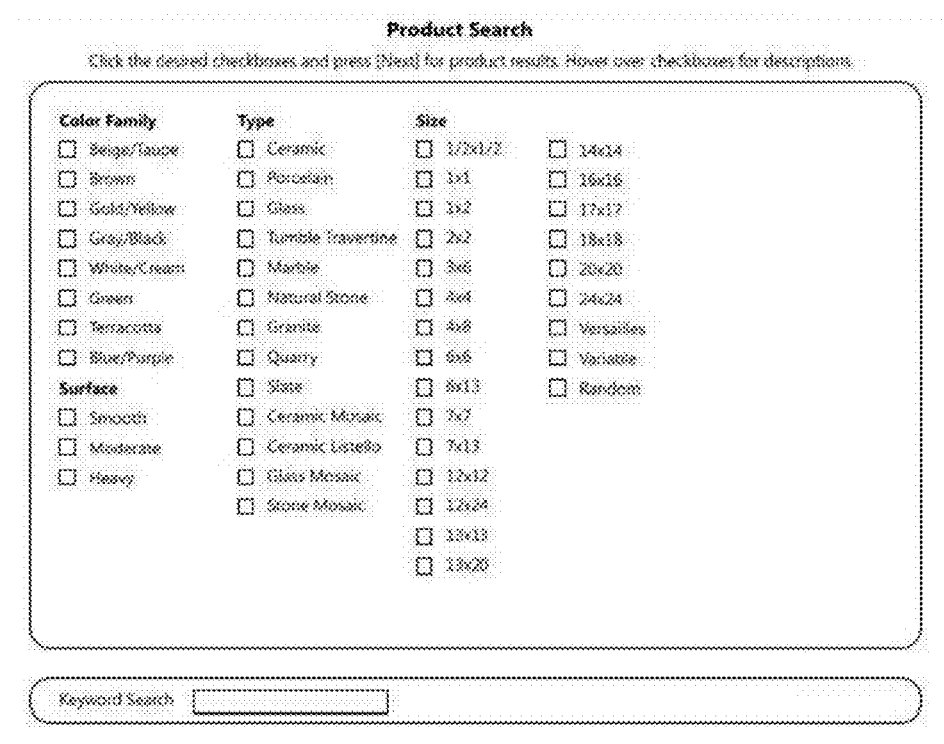

A Product Search page is presented, from which the user selects desired product attributes, as shown in FIG. 9.

Figure 10:
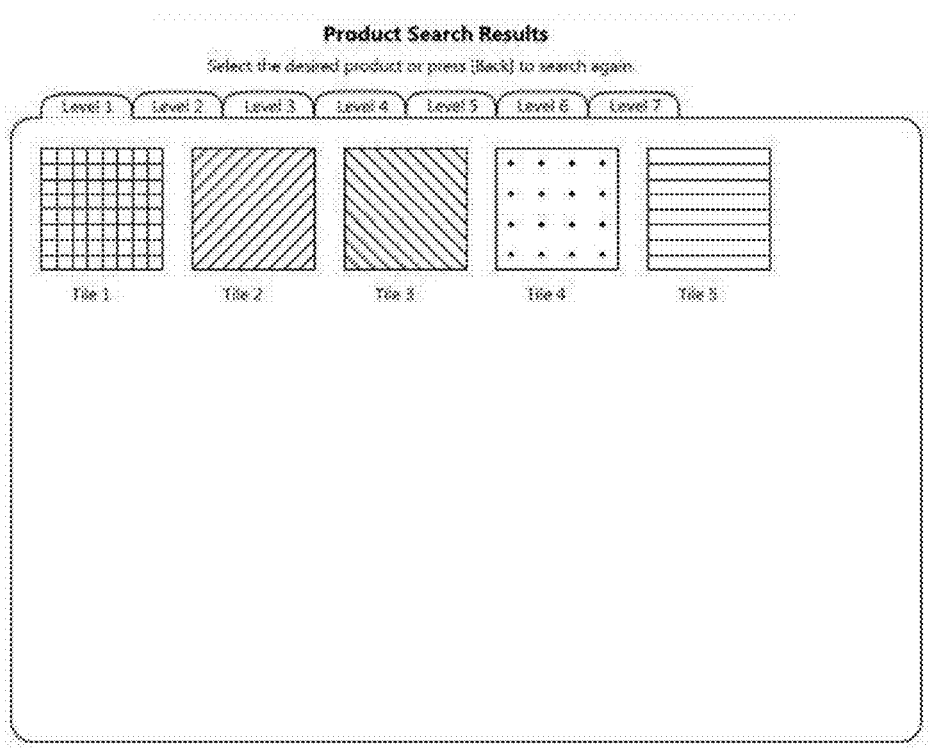
FIG. 10 is a diagrammatic drawing showing a product search results presenter according to a preferred embodiment of the invention

The results of the Product Search are displayed in the Product Search Results page, as shown in FIG. 10. The list is categorized by price levels and presented in tabs, also shown in FIG. 10.

The user selects the desired product. This process can be repeated as often as desired until the selections have been finalized.

Surface Area Creation

A surface area is a contiguous area of a plan dedicated to one product selection. A surface area may encompass one or multiple rooms. When a user switches a room's product selection from one material type to another, (i.e., carpet to tile), the surface areas involved in the reselection must be recalculated and their material requirements re-optimized.

How Concierge Creates Surface Areas:

A series of Material Groups is created, one for each unique combination of rooms/areas assigned to a bill of material for a product such as carpet. For example, a Material Group for carpet may have the Living Room, Family Room, Dining Room and bedrooms grouped together as the standard carpet areas.

Surface Scenarios are created for each Material Group, each of which represents a unique configuration to be tested as a candidate for optimal material layout efficiency. Each scenario contains a collection of Proximity Groups, each of which is comprised of rooms/areas that have direct access (proximity) to one another as represented by the transitions, doors and openings inherited from the Options Estimator configuration.

One or more strategies are created for each Proximity Group, depending on whether the Lay Direction was locked in the Options Estimator for one or more of the rooms/areas. As noted above, the strategies represent allowable configuration candidates, each of which is later scored for material usage efficiency.

Exclusion zones are automatically defined when fixtures and other objects are placed on the floor plan in the Options Estimator. These represent areas for which material will be omitted, such as under cabinets. These zones are geometrically subtracted from the strategy's geometry.

Material Optimization

During the Material Optimization phase of calculation, Surface Areas are further refined by splitting them up into smaller pieces until every piece is small enough to be packed inside the selected product's material dimensions without any portion running over beyond any of its physical boundaries.

Acceptable, potentially material-saving technique scenarios are also constructed and tested to determine whether their use would result in an even greater material optimization. These techniques include head cross seams and side cross seams for roll-based material such as carpet and vinyl.

How Concierge Optimizes Material Usage:

The geometries contained in each Proximity Group Strategy are split into smaller geometries that will eventually represent collections of material cuts to be packed and scored for optimization efficiency. During this process, several techniques are employed that influence the construction and shape of the cuts:

Pattern start points locked in the Options Estimator.

The application of seams as governed by a geometrically center weighted traffic weight value of each room's surrounding rooms/areas, calculated as a function of the placement of the connecting doors and openings.

Default and Failover Start Points.

The Pattern Start is used to create seam lines that split rooms/areas into regions. Seams that have been placed manually in Options Estimator are applied to the Regions to split them up into smaller Regions.

The Generic Part's attributes are used to further split each Region into Sectors. For example, if a Region is 15 feet wide and the Material Group's Generic Part is 12 feet wide, two or more Sectors are created, each one of which spans no more than 12 feet in width.

Initial Cuts are created from the Sectors and manual cross seams inherited from Options Estimator are applied to the cuts, thereby splitting the affected cuts into yet more cuts. The cuts are defined as a series of Edges, which are cut boundaries adjusted for the Generic Part's seam overlap value and other factors. Seam Overlap is the amount of material along a side edge that is required to be overlapped with the adjacent material to create a straight seam during installation.

After each strategy is constructed, it is sent to a material packer for scoring.

The packing run that uses the least amount of material is used as the final result. If two runs are tied as to material usage, the run with the fewest number of cuts is used.

Pricing

Figure 11:
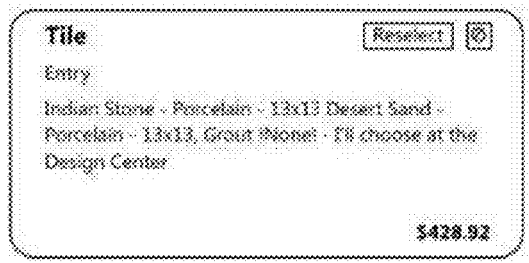
FIG. 11 is a diagrammatic drawing showing an area price presenter according to a preferred embodiment of the invention

As noted above, upon selection of the desired product, the Calculator executes the Surface Areas and Material Optimization algorithms and returns to Concierge material requirements for each of the selected products. A unit price is applied to each product quantity and the resulting extended price is presented in a separate cell for review by the end user, as shown in FIG. 11.

Plan Merge-Overview

Residential homebuilders typically offer a collection of preconfigured, fixed plans featuring standard rooms and features. On top of the fixed, or base plan offering, many homebuilders offer a number of preconfigured structural/architectural options that allow buyers to tailor a plan to their individual needs. Examples of Architectural Options include reconfiguring a study into a $5^{th}$ bedroom and adding a completely new area to the home such as a bonus room.

The large number of architectural options offered by many builders poses a challenge to the estimating and selection process. In order to accurately price out the flooring selections for a home, its geometry must be based upon the actual Architectural Options purchased by the homebuyer. Predrawing every possible combination of available Architectural Options for each plan is not practical because the permutations grow in a factorial manner. For instance, if just 4 Architectural Options are offered, 24 unique versions of the plan would have to be drawn (1×2×3×4=24) to model all possible combinations.

The present invention overcomes this challenge by providing an environment where the standard areas of the plan and each of its Architectural Options are created individually and assembled into a finished plan that matches the consumer's selections as needed in Concierge. The assemblage of a homebuyer plan from its constituent parts is accomplished through a unique process called Plan Merge.

Estimators draw the Standard (Base) Plan and its Architectural Options in the present invention. Sales Counselors and Designers select this created Base Plan along with the Architectural Options specifically chosen by the Homebuyer to create a Concierge plan that correctly models the homebuyer's purchase.

Plan Configuration

To configure architectural options for a plan in Options Estimator, one or more Architectural Option (AO) Regions are defined. An AO Region is a defined area of a plan where an unlimited number of variations on that portion of the plan can be created. For example, an AO Region can be created for a base plan's Study in preparation for modeling that Study's variations such as a configuration of the room into Bedroom 5.

Once an AO Region has been defined, variations on the portion of the plan drawn inside the Region can be created. Each variation is called an AO Option. A default AO Option is created automatically. This Option includes all the Plan Entities originally drawn in the portion of the plan that is to become drawn into the AO Region. Additional AO Options are created by copying the Region's contents as a whole to an unused area of the plan drawing surface.

Once an AO Option has been copied from the Region (or from an existing AO Option), its contents can be modified as desired, subject to a few rules. Once such rule is that boundaries entering the region cannot be moved or deleted at the point at which they enter the option area. This is necessary to ensure that all room geometries form complete, closed polygons when their Options are plugged into their Region and do not cross other geometries participating in the Option.

Each AO Option is named to provide a description for the Concierge consumer to know which Options to select when creating the homebuyer's plan.

Concierge Plan Merge

As previously described, the process of drawing a plan and its AO Options creates a collection of Plan Entities, each of which is comprised of points. The objective of the Plan Merge process is to assemble the entities of the base plan and the homebuyer's selected AO Options in such a manner as to create a fully formed plan that models the entire home as purchased.

The merge itself is accomplished by creating a new plan constructed from the Plan Entities contained in the base plan combined with those of the consumer's AO Option selections. One of 13 separate merge strategies, each designed to govern the behavior of its assigned plan entity type during the merge process, is employed to create new, reconciled Plan Entities that will make up the new plan.

During the merge, Base and AO Option Plan Entities that share a common origin are identified to create a Replacement Entity Map. The origin is known to be common when one Plan Entity is copied from another during the drawing process. This map is eventually used to determine which entities will be used in the new plan and which will be discarded. Plan Entities that belong to AO Options that were not selected are discarded.

After the participating Plan Entities have been identified and the Replacement Entity Map has been created, the new plan is constructed via a collection of plan merge initialization strategies.

After creation, the new plan is cleaned up by discarding each of its entity's option list which are left over from the transfer of the entity from the old plan.

Finally, the old plan's Product Directives are applied to the new plan. Product Directives govern key aspects of material installation behavior, including the lay direction and pattern start point.

FIG. 1 shows a flow chart detailing the process steps involved in the Plan Merge system and operation. FIG. 1 begins at simple merge constructor step 4000, FIG. 1A.

Figure 1B:
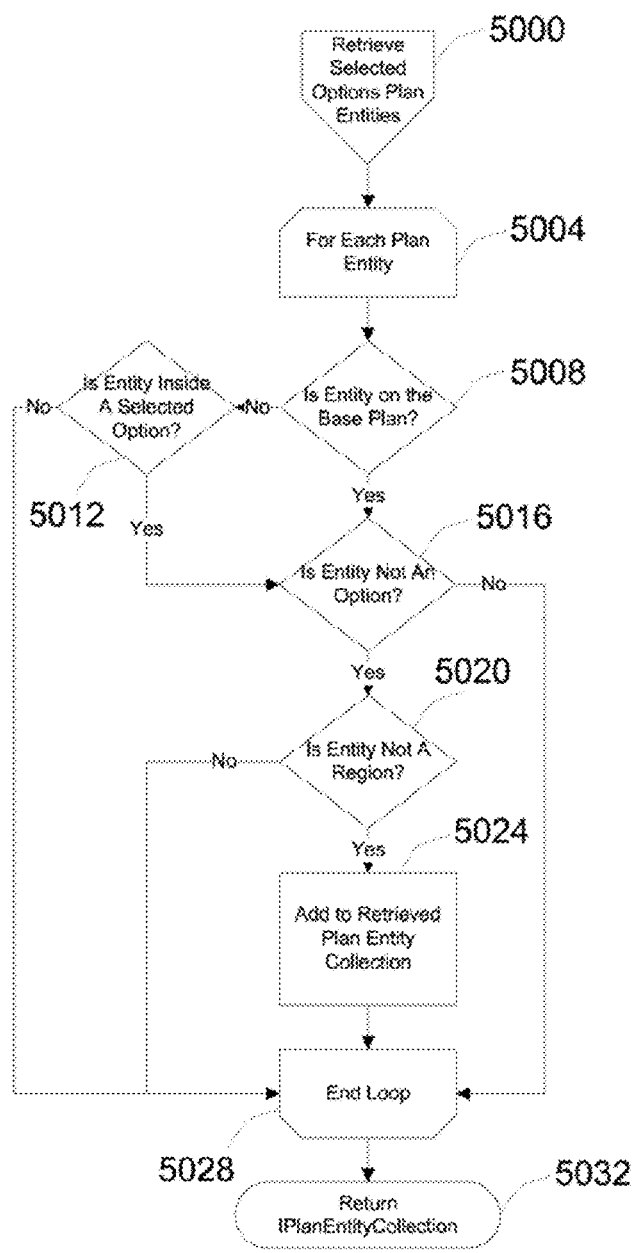
Figure 1C:
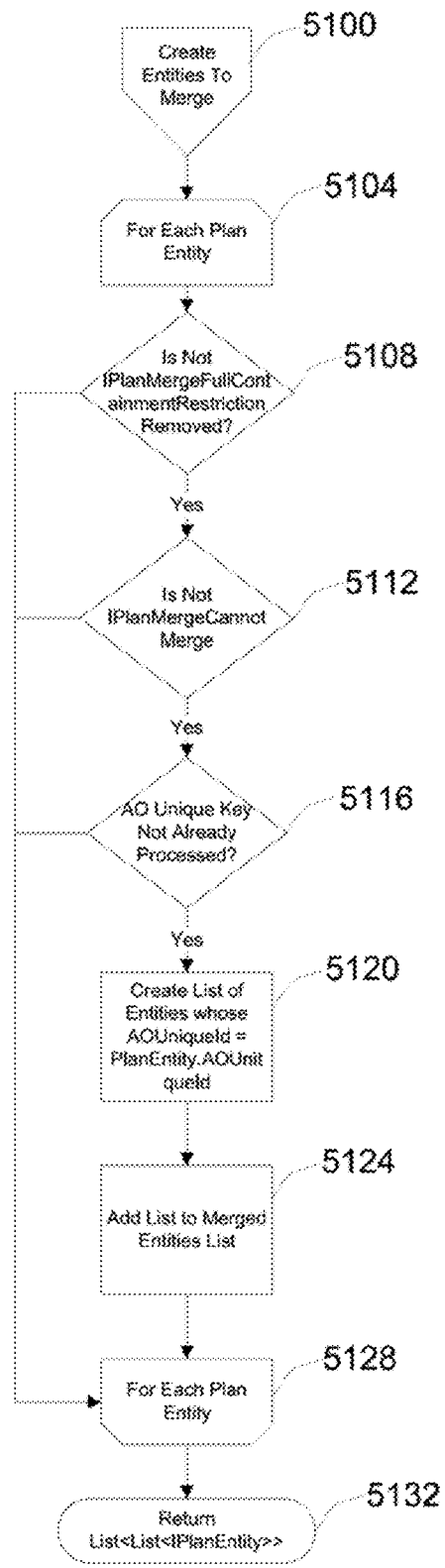
Figure 1D:
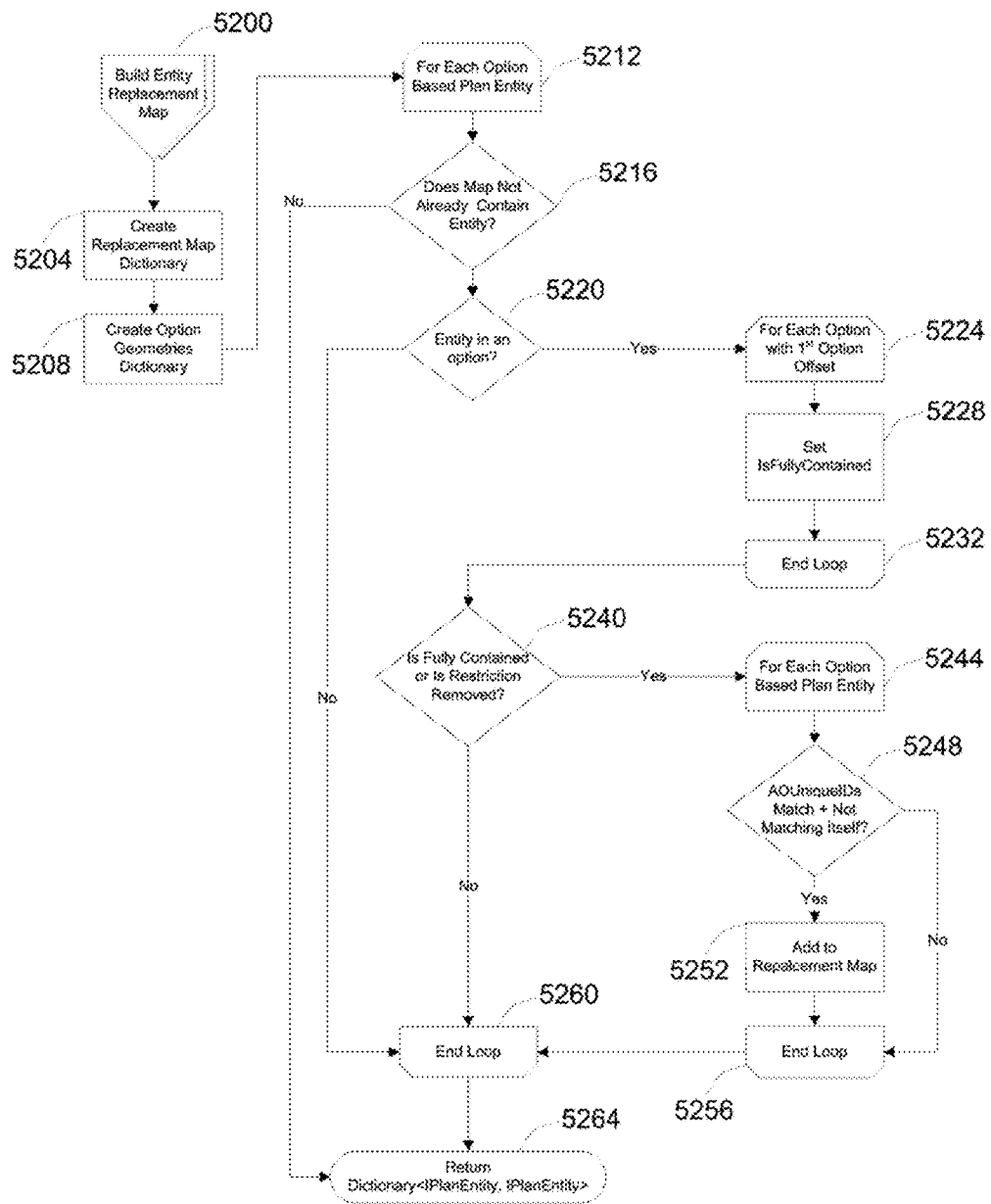
Figure 1E:
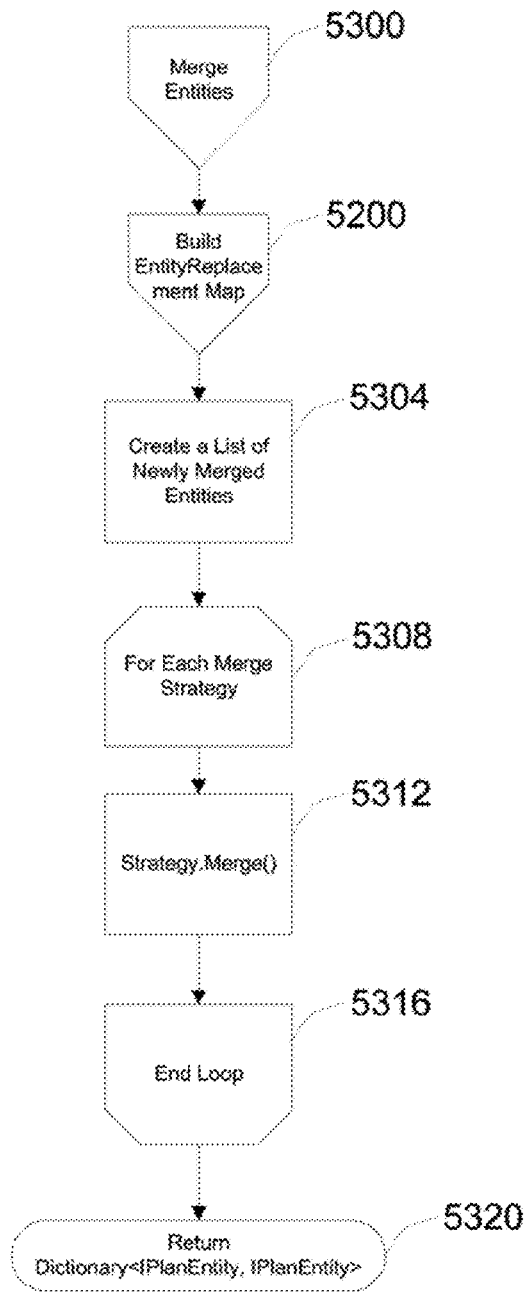
Figure 1F:
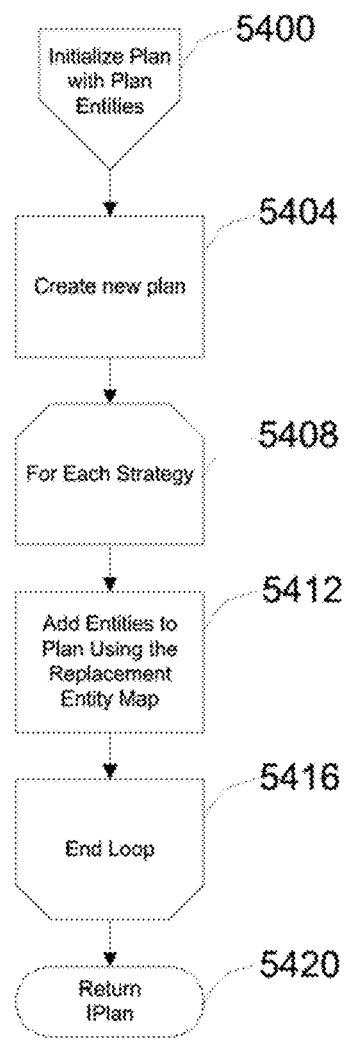
Figure 1G:
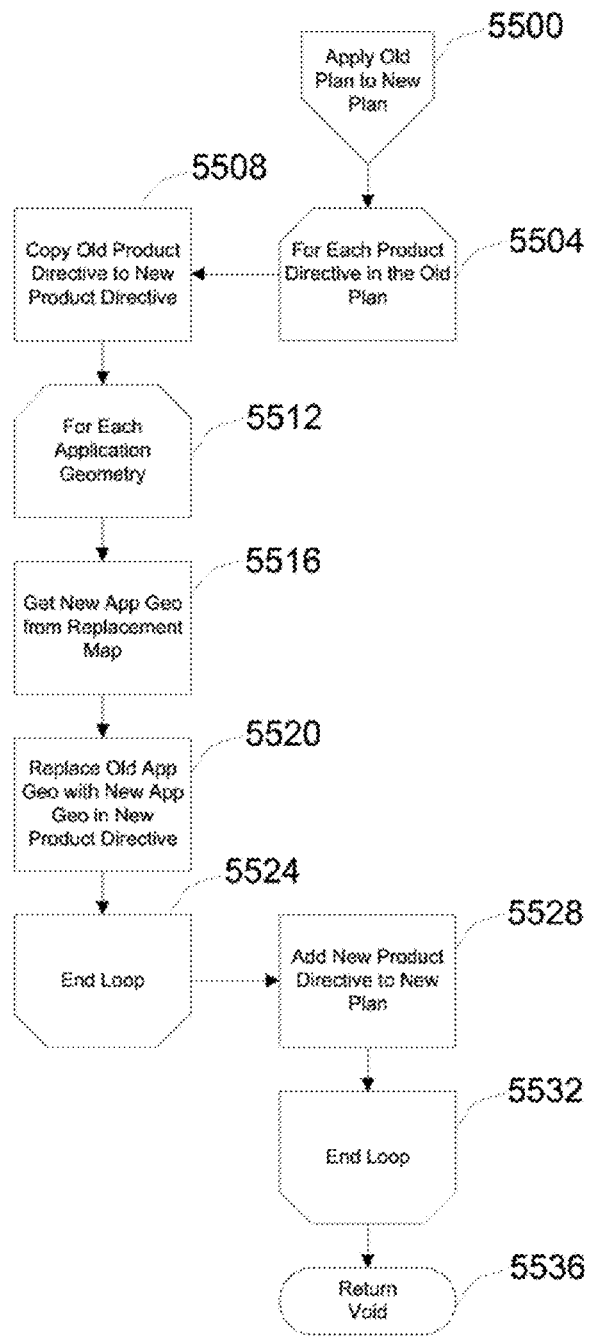
Figure 1H:
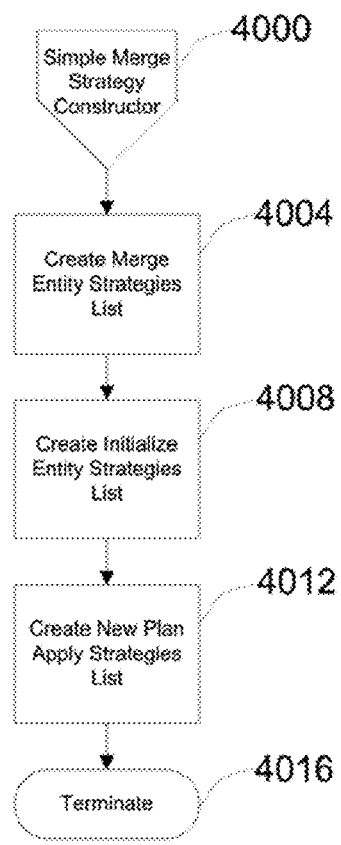

From Process Step 4000, FIG. 1H, proceed to Process Step 4004, Create Merge Entity Strategies List which is a collection of merge strategies, one for each plan entity, including boundaries, opening items, boundary entities, furnishings, fillers, exclusion zone fixtures, flooring application geometries, wall application geometries, rooms, counter tops, sub stairs, stairs and external container. Proceed to Process Step 4008, Create Initialize Entity Strategies which is where a collection of entity strategies is created, one for each pattern start line, plan point, boundary, boundary entities, opening item, furnishings, fillers, exclusion zone fixtures, flooring application geometries, wall application geometries, room, counter tops, sub stair, stair, external container, and one to re-associate fixtures. Proceed to Process Step 4012, Create New Plan Apply Strategies List which is a collection of strategies to apply after the creation of the new plan. Currently only 1 such strategy exists; it transfers Product Directives from the old plan to the new plan. Proceed to Process Step 4016, Terminate. In Process Step 4016 the constructor modifies internal members only—no return value—and ends Process Step 4000.

From Process Step 4000, FIG. 1A, proceed to Process Step 5000, Retrieve Selected Options Plan Entities, which builds a list of plan entities that will participate in the merge, leaving out non-selected options as well as option and region entities.

From Process Step 5000, FIG. 1B, proceed to Process Step 5004, which begins a sequence to identify the plan entities participating in the merge. Process Step 5008 asks the question, "Is the Entity on the Base Plan." If "no," proceed to Process Step 5012, which asks the question, "Is the Entity Inside a Selected Option?" If "no," proceed to Process Step 5028, End Loop. If "yes" is entered to either 5008 or 5012, proceed to Process Step 5016, which asks the question, "Is the Entity Not An Option?" If "no," proceed to Process Step 5028, End Loop. If "yes," proceed to Process Step 5020, which asks the question "Is Entity Not a Region?" If "no," proceed to Process Step 5028, End Loop. If "yes," proceed to Process Step 5024, Add to Retrieved Plan Entity Collection, which indicates these selected entities will participate in the merge. Proceed then to Process Step 5028, End Loop, and Process Step 5032, which will return the collection of plan entities that will be participating in the merger and end Process Step 5000.

From Process Step 5000, proceed to Process Step 5100, Create Entities to Merge, FIG. 1C, which builds a list of "combines"—lists of at least two entities each sharing the same AOUniqueID, i.e., require merging.

From Process Step 5100, FIG. 1C, proceed then to Process Step 5104, For Each Plan Entity, proceed to Process Step 5108, which asks the question "Is not IPlan Merge Full Containment Restriction Removed?" Plan Entities like Plan Point that implement this behavior will be handled elsewhere. If "no," proceed to Process Step 5128, For Each Plan Entity. If "yes," proceed to Process Step 5112, which asks the question "Is Not IPlanMerge Cannot Merge?" If "no," proceed to Process Step 5128, For Each Plan Entity. If "yes," proceed to Process Step 5116, which asks the question "Is the AO unique key not already processed?" Only the first Plan Entity with a given AO Unique Key is processed because the list generated (in Process Step 5120) already contains all entities sharing the AO Unique Key. If "no," proceed to Process Step 5128, For Each Plan Entity. If "yes," proceed to Process Step 5120, Create List of Entities whose AOUniqueID=PlanEntity.AOUnitqueID. Each time a new AOUniqueID is found, a list of all entities sharing that ID is generated. Proceed to Process Step 5124, Add List to Merged Entities List. Proceed to Process Step 5128, For Each Plan Entity, and Process Step 5132, Return List<List<IPlanEntity>>. Process Step 5132 returns a filtered list of Plan Entity lists that need to be merged, i.e., each list contains at least 2 entities that share the same AOUniqueID and will end Process Step 5100.

From Process Step 5100, FIG. 1A, proceed to Process Step 5200, Build Entity Replacement Map, which will build a map of entities sharing the same AOUniqueID that will replace other entities during the merge process.

From Process Step 5200, FIG. 1D, proceed to Process Step 5204, Create replacement Map Dictionary. Proceed to Process Step 5208, Create Option Geometries Dictionary, to create empty dictionaries to hold the tracking list. Proceed to Process Step 5212, For Each Option Based Plan Entity. Proceed to Process Step 5216, which asks the question "Does map not already contain entity?" If "no," proceed to Process Step 5264, Return Dictionary<IPlanEntity, IPlanEntity>. Process Step 5264 returns the ReplacementEntityMap, a dictionary of plan entities and the entity that will be used to replace them during merge and will end Process Step 5200. If "yes," proceed to Process Step 5220, which asks the question "Is the Entity in an option?" If "no," proceed to Process Step 5260, End Loop and Process Step 5264, Return Dictionary<IPlanEntity, IPlanEntity>. Referring to Process Step 5220, if "yes," proceed to Process Step 5224, For Each Option with 1$^{st}$ Option Offset. All options of the entity that have the same offset as the first option in the list, i.e., are in the same option. Proceed to Process Step 5228, Set is Fully Contained. Proceed to Process Step 5232, End Loop. Proceed to Process Step 5240, which asks the question "Is entity fully contained or is restriction removed?" Some entity types do not have to be fully contained. If "no," proceed to Process Step 5260. If "yes," proceed to Process Step 5244, For Each Option Based Plan Entity. Proceed to Process Step 5248, which asks the questions "AOUniqueIDs Match+Not Matching Itself?" If "no," proceed to Process Step 5256, End Loop, then to Process Step 5260, End Loop. If "yes," proceed to Process Step 5252, "Add to Replacement Map." A dictionary of entities sharing the same AOUniqueID, the dictionary value of which will replace the dictionary key in the plan. Proceed to Process Step 5256, End Loop. Proceed to Process Step 5260, End Loop. Proceed to Process Step 5264, Return Dictionary<IPlanEntity, IPlanEntity>, which will end Process Step 5200.

From Process Step 5200, FIG. 1A, proceed to Process Step 5300, Merge Entities. Use the replacement map to merge each of the appropriate entities for each strategy into a single entity for the new plan.

From Process Step 5300, FIG. 1E, proceed then to Process Step 5200, Build Entity Replacement Map, the steps to which were previously described on FIG. 1D. Proceed to Process Step 5304, Create a list of Newly Merged Entities. The process empties the list to store the newly merged entities with which to create the merged plan. Proceed to Process Step 5308, For Each Merge Strategy. Proceed to Process Step 5312, Strategy.Merge. Do the merge employing specialized strategy according to each plan entity's type in the combine list, adding the result to the Replacement Entity Map. Proceed to Process Step 5316, End Loop and Process Step 5320, Return to Replacement Entity Map updated with new replacement entities and to end Process Step 5300.

From Process Step 5300, FIG. 1A, proceed to Process Step 4004, Create New Plan Merge Output Context. Create a dictionary where each key will be a merged entity to be used in the new plan and the value will be a list of the entities—the original entities. The context is used later to build BOMs for the new plan. Proceed to Process Step 5400, Initialize Plan with Plan Entity, which uses the options based entities to update the plan entities for the new plan.

From Process Step 5400, FIG. 1F, proceed to Process Step 5404, Create New Plan. Proceed then to Process Step 5408, For Each Strategy. Proceed then to Process Step 5412, Add Entities to Plan Using the Replacement Entity Map. Each strategy is responsible for its own entity types. Proceed then to Process Step 5416, End Loop. Proceed then to Process Step 5420, Return IPlan, which returns the new plan, initialized with its plan entities and will end Process Step 5400.

From Process Step 5400, FIG. 1A, proceed to Process Step 4008, Clear Options List. Remove the option list for each entity inherited from the old plan. No options are needed in the new plan because it is a homebuyer plan created as a result of selecting options. Proceed to Process Step 5500, Apply Old Plan to New Plan. Update Application Geometry List and Product Directives on the New Plan.

From Process Step 5500, FIG. 1G, proceed to Process Step 5504, For Each Product Directive in the Old Plan. Proceed then to Process Step 5508, Copy Old Product Directive to New Product Directive. Proceed then to Process Step 5512, For Each Application Geometry. Proceed then to Process Step 5516, Get New App Geo from Replacement Map. Proceed then to Process Step 5520, Replace Old App Geo with New App Geo in New Product Directive. Proceed then to Process Step 5524, End Loop. Proceed then to Process Step 5528, Add New Product Directive to New Plan. Proceed then to Process Step 5532, End Loop. Proceed then to Process Step 5536, Return Voiced, which returns the modified New Plan, passed in by reference and will end Process Step 5500.

From Process Step 5500, FIG. 1A, proceed to Process Step 4012, Return (Plan. Process Step 4012 will return the merged plan and end Simple Plan Merge Strategy.

The VEO Calculator-Overview

The Calculator is responsible for breaking down a floor plan into multiple surface scenarios, each of which serves as a candidate for optimizing the calculated material layout for the plan.

A series of Material Groups is created, one for each unique combination of rooms/areas assigned to a bill of material for a product such as carpet. For example, a Material Group for carpet may have the Living Room, Family Room, Dining Room and bathrooms grouped together as the standard carpet areas. Multiple Material Groups may be created for a product due to multiple specifications being calculated simultaneously or to calculate rooms separately for the same material. A specification is a directive from a builder that dictates, among other things, standards for installing material. For instance, a specification may dictate that a tile shower stall is to be installed with cement backer board. Multiple specifications can be created for a plan to model different standards for a given set of communities or for a given set of builder brand-differentiated plans.

Surface Scenarios are created for each Material Group, with each scenario representing a unique configuration to be tested for material layout efficiency. Each scenario contains a collection of Proximity Groups, each of which is comprised of rooms/areas that have access (proximity) to one another as configured by the transitions, doors and openings drawn by the user.

One or more strategies are created for each Proximity Group, depending on whether the user has locked the Lay Direction for one or more of the rooms/areas. As noted above, the strategies represent allowable configuration candidates, each of which is scored for material usage efficiency.

The Strategy Scoring process includes splitting the strategy's geometry into geometries that will eventually represent material cuts and packing those cuts onto a material sheet. During this process, several techniques are employed that influence the construction of the cuts:

User-Locked Pattern Start Points.

The application of seams as governed by a geometrically center weighted traffic weight value of each room's surrounding rooms/areas, calculated as a function of the placement of the connecting doors and openings.

Default and Failover Start Points.

Exclusion zones are defined when users draw fixtures and other objects. They represent areas for which material will not be calculated, such as under cabinets. These zones are geometrically subtracted from the strategy's geometry.

The Pattern Start is used to create seam lines that split rooms/areas into regions. Seams that have been placed manually by the user are applied to the Regions to split them up into smaller Regions.

Each Material Group contains a Generic Part that contains attributes that model the physical attributes of a representative material. For example, a typical Generic Part for carpet may specify that its width is 12 feet and that a seam overlap of 1 inch must be included in calculating material requirements. In all, the Generic Part contains approximately 30 separate characteristics.

The Calculator uses the Material Group's Generic Part to further split each Region into Sectors. For example, if a Region is 15 feet wide and the Material Group's Generic Part is 12 feet wide, two or more Sectors are created, each one of which spans no more than 12 feet in width.

Initial Cuts are created from the Sectors and user-placed Manual Cross Seams are applied to the Cuts, thereby splitting the affected Cuts into yet more Cuts. The Cuts are defined as a series of Edges, which are Cut boundaries adjusted for the Generic Material's Seam Overlap and other factors. Seam Overlap is the amount of material along a side edge that is required to be overlapped with the adjacent material to create a straight seam during installation.

After each Strategy is constructed, it is sent to the Packer for scoring.

The packing run that uses the least amount of material is used as the final result. If two rungs are tied as to material usage, the run with the fewest number of cuts is used.

FIG. 2 shows a flow chart of the operation of the Calculator according to a preferred embodiment of the invention and begins with Process Step 20, Run Calculations.

Figure 2A:
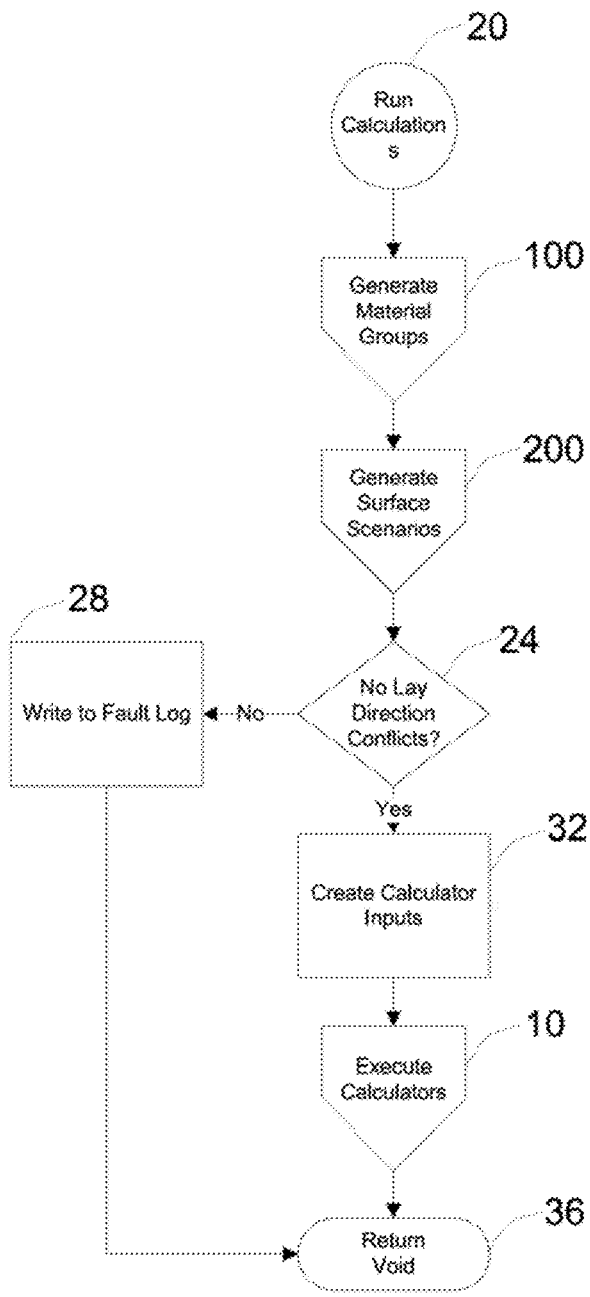
FIG. 2A through 2U is a flow chart showing a software program for a calculator according to a preferred embodiment of the invention.

From Process Step 20, FIG. 2A, proceed to Process Step 100, Generate Material Groups, which generates material groups for every BOM to be calculated.

Figure 2B:
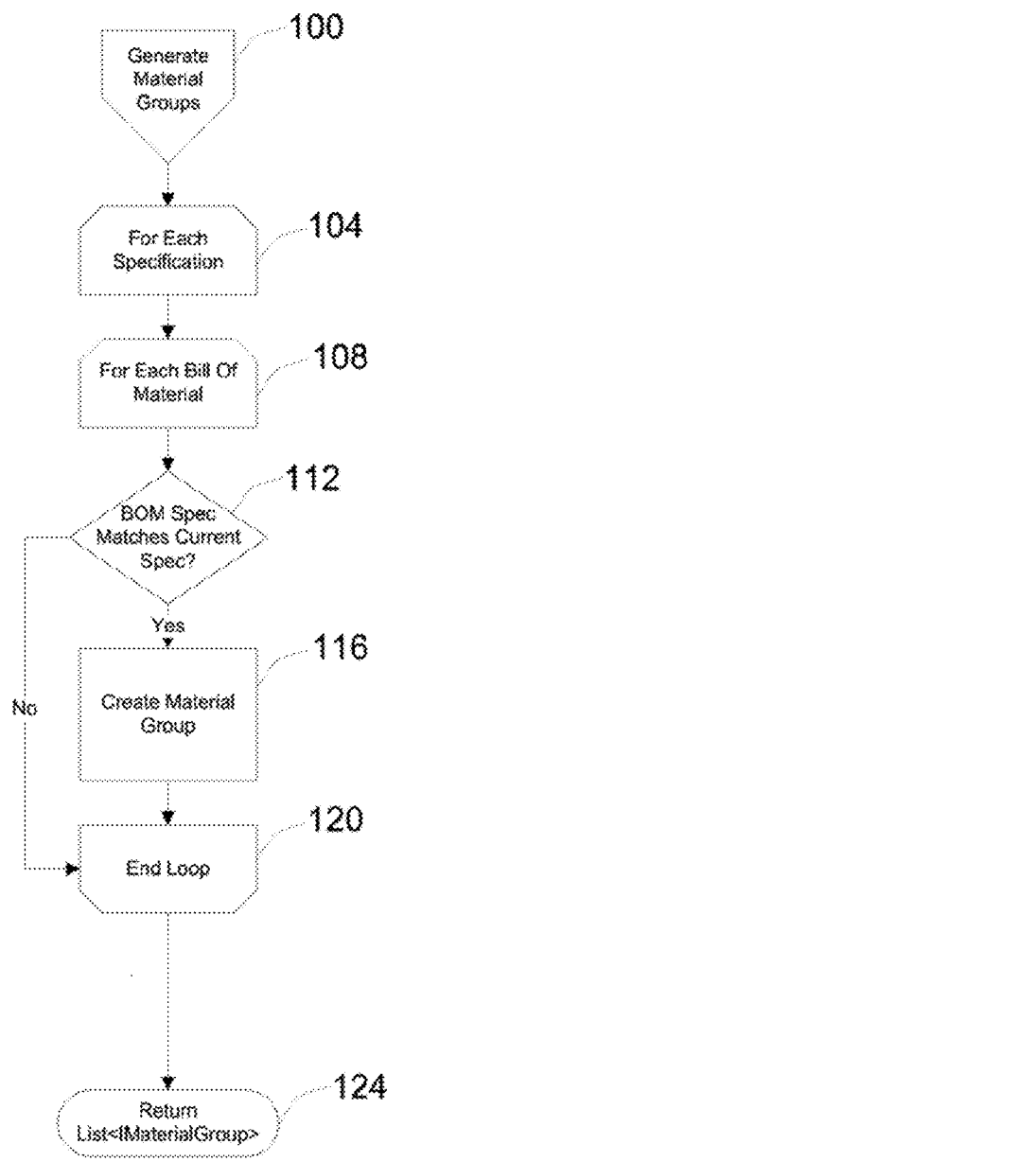

From Process Step 100, FIG. 2B, proceed to Process Step 104 which processes for each Specification. Every BOM whose specification matches the spec list selected by the user will be calculated. Proceed then to Process Step 108, For Each Bill of Material. Bills of Material (BOMs) are stored for every separate installation in the home, e.g., Kitchen/Granite Counter Top, Entry/Wood Floor, etc. Proceed then to Process Step 112, which asks the question "BOM Spec Matches Current Spec?" If "no," proceed to Process Step 120, End Loop. If "yes," proceed to Process Step 116, Create Material Group. A material group is comprised of a collection of rooms or areas, an application, a product and estimate-level calculator directives for the part being calculated. Proceed then to Process Step 120, End Loop and Process Step 124, Return List, returning the generated list of material groups to calculate and will end Process Step 100.

From Process Step 100, FIG. 2A, proceed to Process Step 200, Generate Surface Scenarios. Process Step 200 generates surface scenarios to process.

Figure 2C:
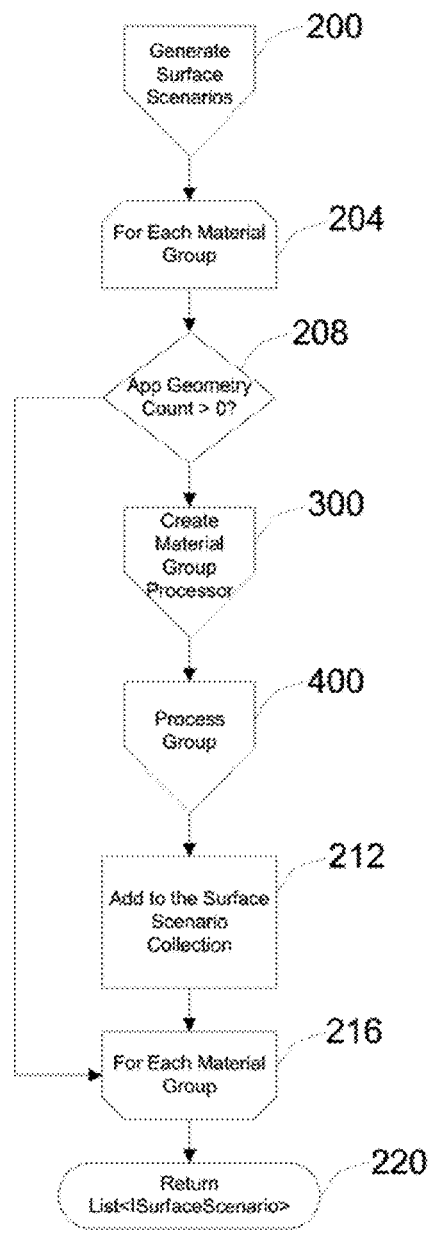

From Process Step 200, FIG. 2C, proceed to Process Step 204 For Each Material Group. Proceed then to step 208, which asks the question, "App Geometry Count>0?" If "no," proceed to Process Step 216, For Each Material Group and to Process Step 220. If "yes," proceed to Process Step 300, Assign a material group processor and populate with a material group and the plan.

From Process Step 300, FIG. 2E, Proceed to Process Step 304, Store Material Group. Proceed then to Process Step 308, Store Plan. Proceed then to Process Step 312, Terminate. In Process Step 312, the Material Group Processor constructor set's the object's material group and plan properties. Process Step 312 will end Process Step 300.

From Process Step 300, FIG. 2C, proceed to Process Step 400, Process Group. Generate Surface Scenario for the Material Group.

From Process Step 400, FIG. 2E, proceed then to Process Step 500, Create Simple Scenario Builder.

From Process Step 500, FIG. 2F, proceed to Process Step 504, Store Generic Information. Proceed then to Process Step 508, Create new PlanEntityDictionary_thresholdEntities. Proceed then to Process Step 512, Terminate. In Process Step 512 the constructor sets generic part and threshold entities. Process Step 512 will end Process Step 500.

From Process Step 500, FIG. 2E, proceed to Process Step 600, Get Scenario.

From Process Step 600, FIG. 2F, Proceed then to Process Step 604, Get Proximity Groups. Proximity Groups include Material Group, Generic Part, Plan, Empty List of ScenarioProximityGroup. Proceed then to Process Step 608, Create Reference Key Collection. Proceed then to Process Step 700, Create Scenario Proximity Groups.

Figure 2D:
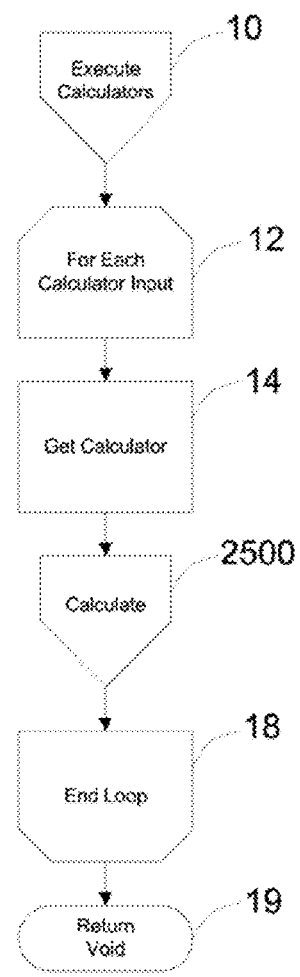
Figure 2G:
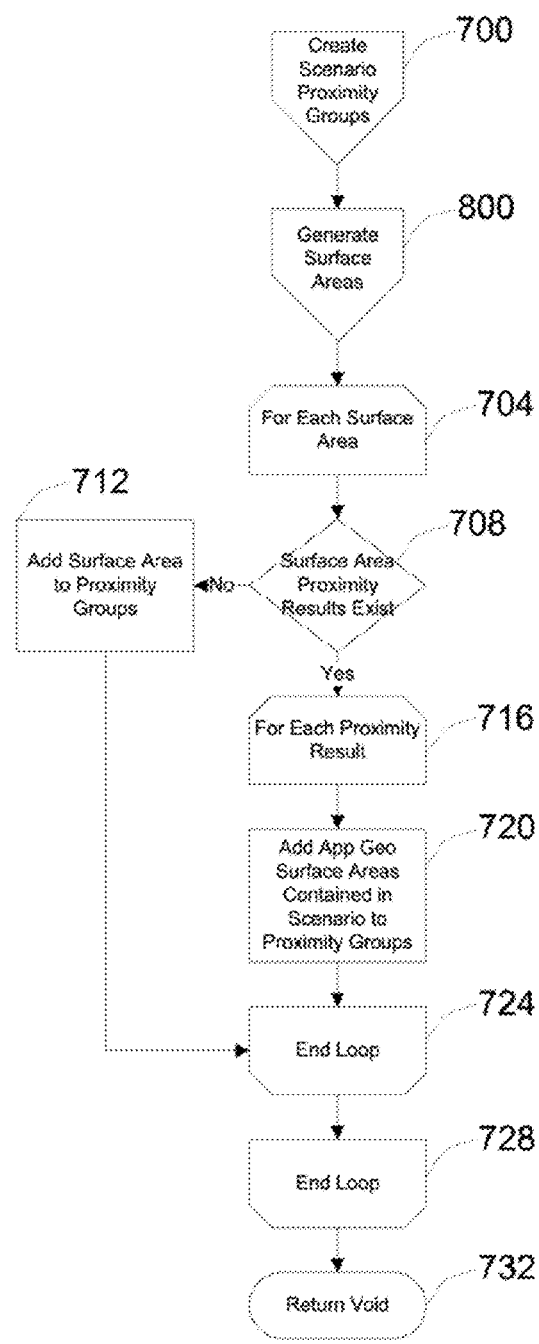

From Process Step 700, FIG. 2G, proceed to Process Step 800, Generate Surface Areas. Process Step 800 generates surface areas for each of the application geometries in the material group, complete with proximity results that govern whether the application geometries can be combined into a single surface area for calculation purposes.

Figure 2H:
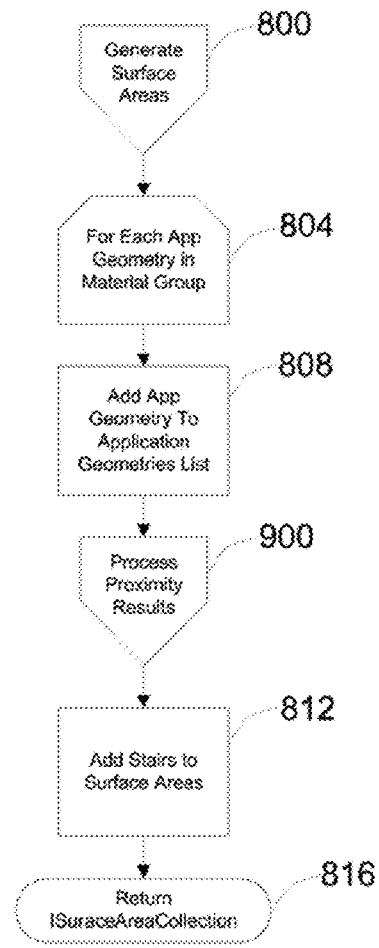

From Process Step 800, FIG. 2H, Proceed then to Process Step 804, For Each App Geometry in Material Group. Proceed then to Process Step 808, Add App Geometry to Application Geometries List. Proceed then to Process Step 900, Process Proximity Results.

Figure 2I:
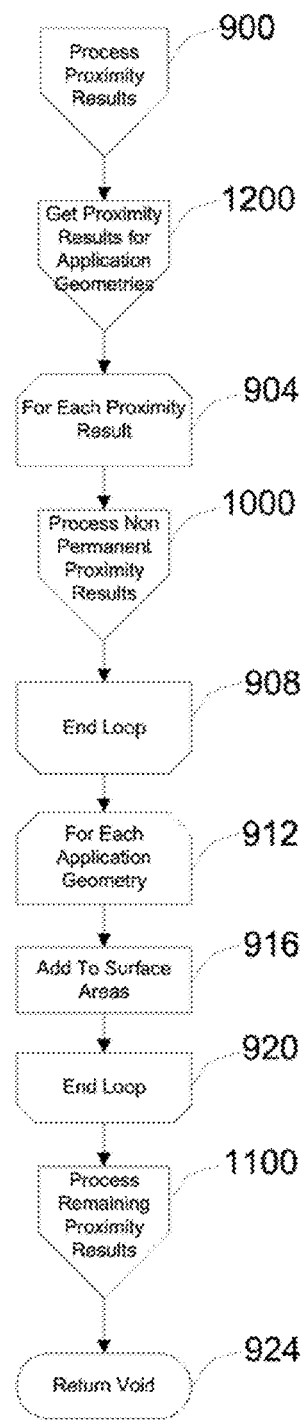

From Process Step 900, FIG. 2I, proceed to Process Step 1200, Get Proximity Results for Application Geometries.

Figure 2J:
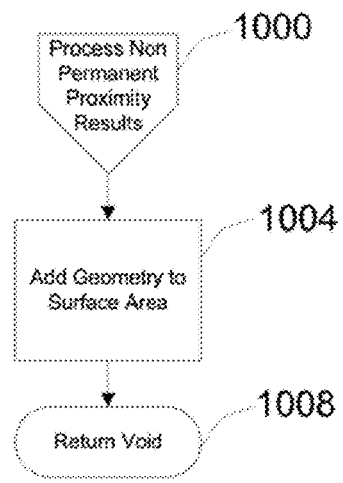
Figure 2K:
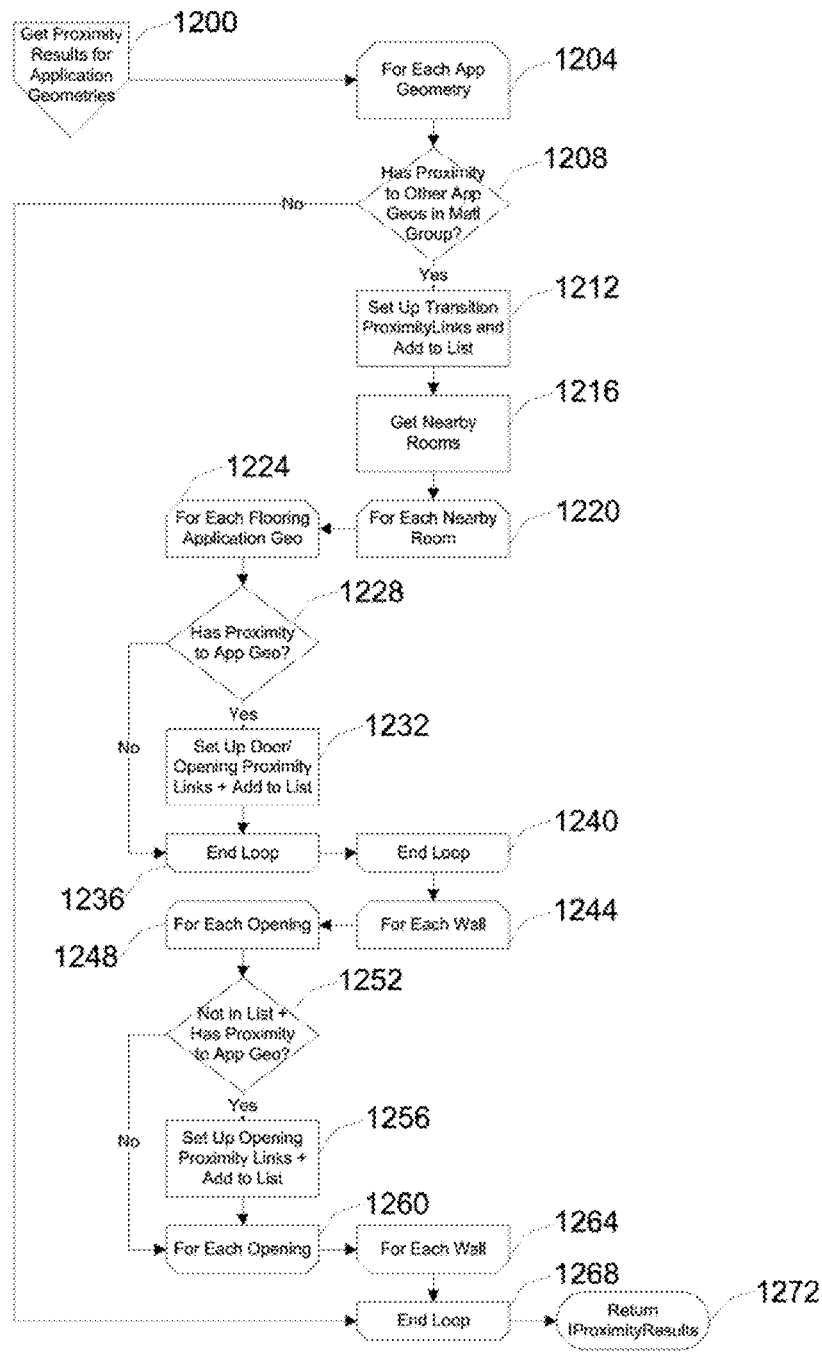

From Process Step 1200, FIG. 2K, proceed then to Process Step 1204, For Each App Geometry. Proceed then to Process Step 1208, which asks the question, "Has Proximity to Other App Geos in Matl Group?" If App Geos are within close proximity of each other within a tolerance, then they have proximity. If "no," proceed to Process Step 1268, End Loop. Return a collection of proximity results for a list of rooms/areas. If "yes," proceed to Process Step 1212, Set Up Transition ProximityLinks and Add to List. Transition has proximity to 2 flooring application geometries in a room. Proceed then to Process Step 1216, Get Nearby Rooms. Process nearby rooms. Proceed then to Process Step 1220, For Each Nearby Room. Proceed then to Process Step 1224, For Each Flooring Application Geo. Proceed then to Process Step 1228, which asks the question, "Has proximity to App Geo?" If "no," proceed to Process Step 1236, End Loop. If "yes" proceed to Process Step 1232, Set Up Door/Opening Proximity Links+Add to List. Each room references common doors and openings. Proceed then to Process Step 1236, End Loop. Proceed to Process Step 1240, End Loop. Proceed then to Process Step 1244, For Each Wall. Proceed then to Process Step 1248, For Each Opening. Proceed then to Process Step 1252, which asks the question, "Not in List+Has Proximity to App Geo?" If "no," Proceed to Process Step 1260. For Each Opening, then Process Step 1264 "For Each Wall," then Process Step 1268, "End Loop." Referring to Process Step 1252, if "yes," proceed to Process Step 1256, Set up Opening Links+Add to List. Process doors that have proximity to the flooring application geometry but do not connect to another room. Proceed to Process Step 1260, for Each Opening, then Process Step 1264 "For Each Wall," then Process Step 1268, "End Loop," then Process Step 1272, Return IProximityResults. Process Step 1272 will return a collection of proximity results for a list of rooms/areas and will end Process Step 1200.

From Process Step 1200, FIG. 2I, proceed to Process Step 904, For Each Proximity Result. Proceed then to Process Step 1000, Process Non Permanent Proximity Results. Adds proximity results to surface areas for non permanent proximity link.

From Process Step 1000, FIG. 2J, proceed to Process Step 1004, Add Geometry to Surface Area. Proceed then to Process Step 1008, Return Void, Modify the Proximity Result, passed in by reference. Process Step 1008 will end Process Step 1000.

From Process Step 1000, FIG. 2I, proceed to Process Step 908, End Loop. Proceed then to Process Step 912, For Each Application Geometry. Proceed then to Process Step 916, Add to Surface Area. Proceed then to Process Step 920, End Loop. Proceed then to Process Step 1100, Process Remaining Proximity Results, which processes permanent proximity links.

Figure 2L:
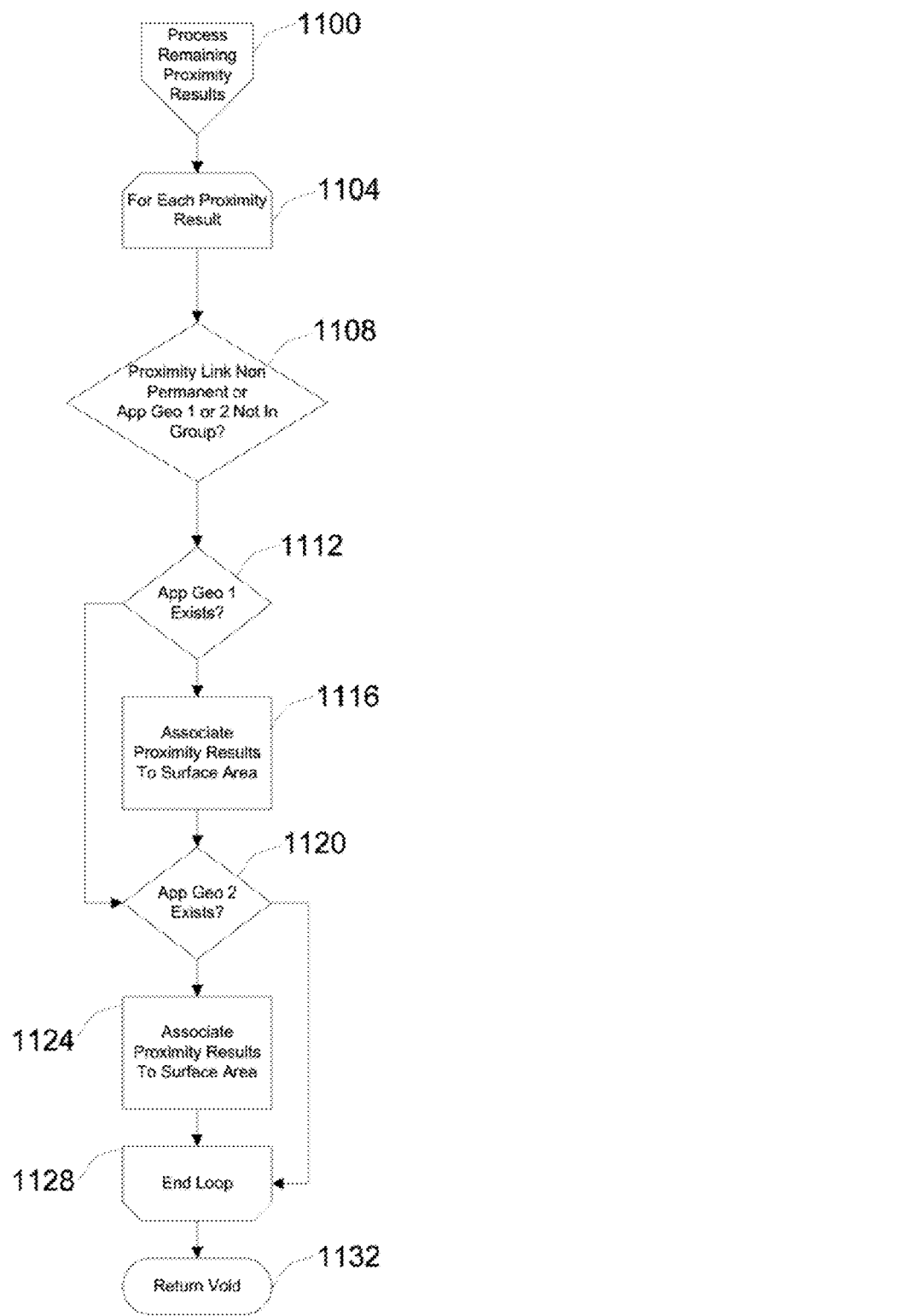

From Process Step 1100, FIG. 2L, proceed to Process Step 1104, For Each Proximity Results. Proceed then to Process Step 1108, Proximity Link Non Permanent or App Geo 1 or 2 Not in Group? Proceed then to Process Step 1112, which asks the question, "App Geo 1 Exists?" If "no," proceed then to Process Step 1120, which asks the question, "App Geo 2 Exists?" If "no," proceed to Process Step 1128, End Loop. Referring to Process Step 1112, if "yes" proceed to Process Step 1116, Associate Proximity Results to Surface Area. Adds the application geometry's proximity results to the surface area. Proceed then to Process Step 1120, App Geo 2 Exists. Referring to Process Step 1120, if "no" is covered above, if "yes" proceed to Process Step 1124, Associate Proximity Results to Surface Area. Proceed then to Process Step 1128, End Loop. Proceed then to Process Step 1132, Return Void. Process Step 1132 will call routine to modify the proximity results, passed in by reference and will end Process Step 1100.

From Process Step 1100, FIG. 2I, Process Remaining Proximity Results, proceed to Process Step 924, Return Void. Call routines to generate proximity results for the collection of rooms/areas, a property called_appGeometries. Process Step 924 will end Process Step 900.

From Process Step 900, FIG. 2H, proceed to Process Step 812, Add Stairs to Surface Areas. Proceed to Process Step 816, Return ISurfaceAreaCollection. Process Step 816 will return the generated surface area list for the material group and will end Process Step 800.

From Process Step 800, FIG. 2G, proceed to Process Step 704, For Each Surface Area. Proceed then to Process Step 708, Surface Area Proximity Results Exist. If "no," proceed to Process Step 712, Add Surface Area to Proximity Groups. Proceed to Process Step 724, End Loop. If "yes" proceed to Process Step 716, For Each Proximity Results. Proceed to Process Step 720, Add App Geo Surface Areas Contained in Scenario to Proximity Groups. Proceed to Process Step 724, End Loop. Proceed to Process Step 728, End Loop. Proceed then to Process Step 732, Return Void. Process 732 will modify the Surface Areas property of the Simple Scenario Builder and will end Process 700.

From Process Step 700, FIG. 2F, proceed to Process Step 612, Create Surface Scenario. Use the material group to create surface scenario. Proceed then to Process Step 1300, Create Strategies for Proximity Groups. Score all of the strategies and choose the best one for each proximity group.

Figure 2M:
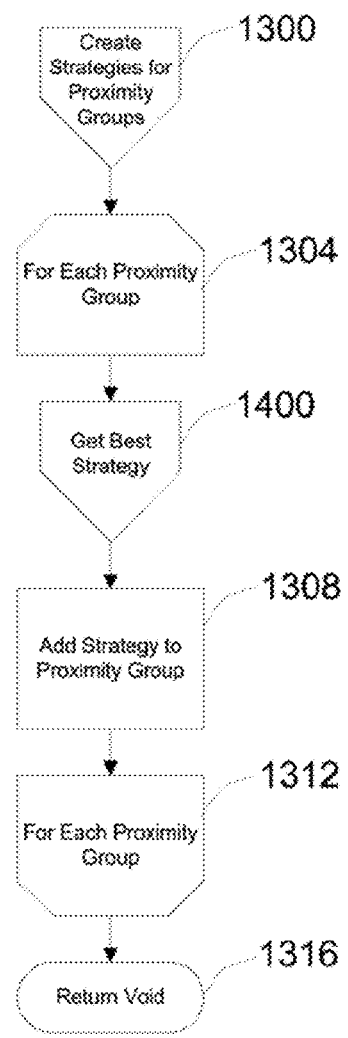

From Process Step 1300, FIG. 2M, proceed to Process Step 1304, For Each Proximity Group. Proceed then to Process Step 1400, Get Best Strategy.

Figure 2N:
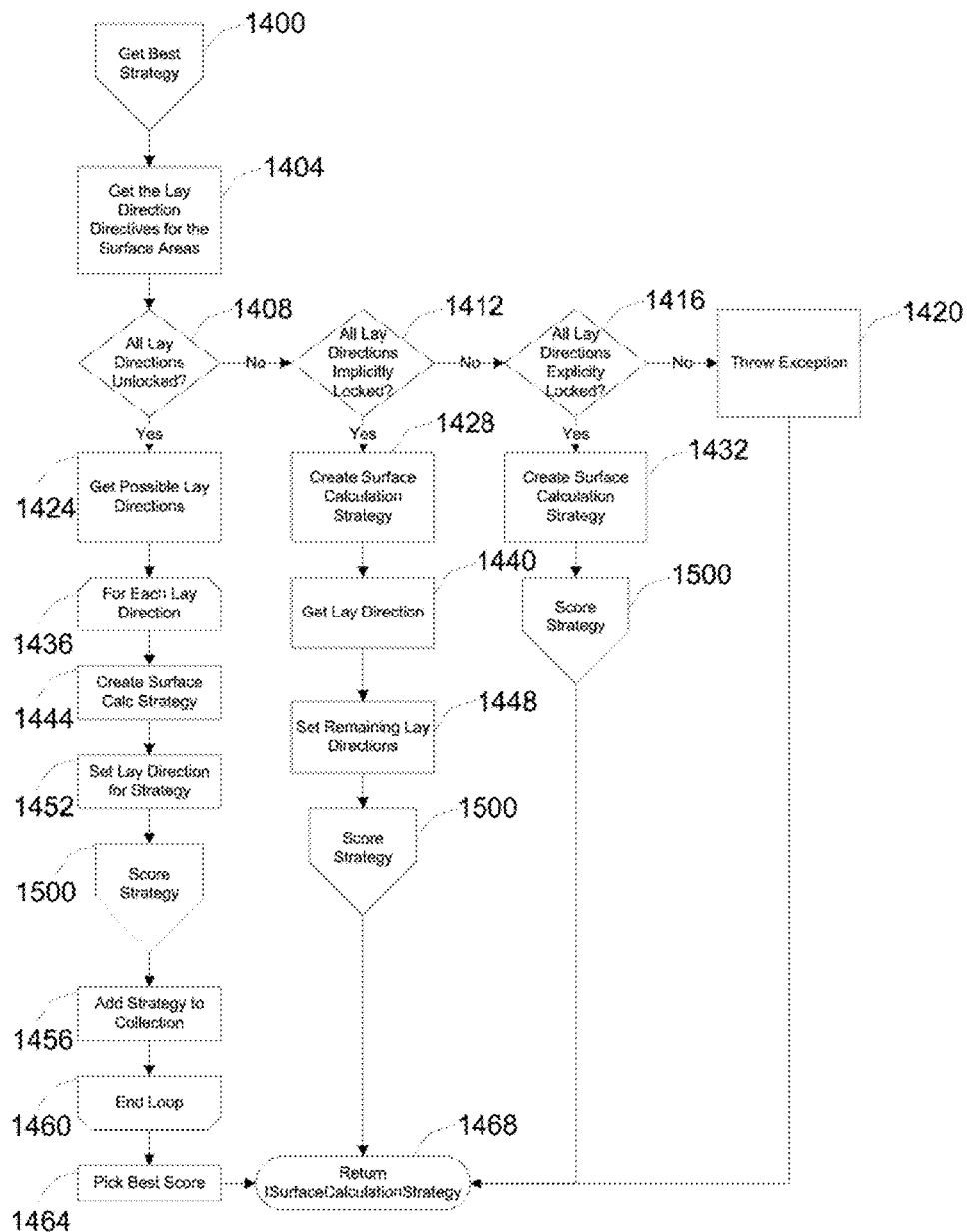
Figure 20:
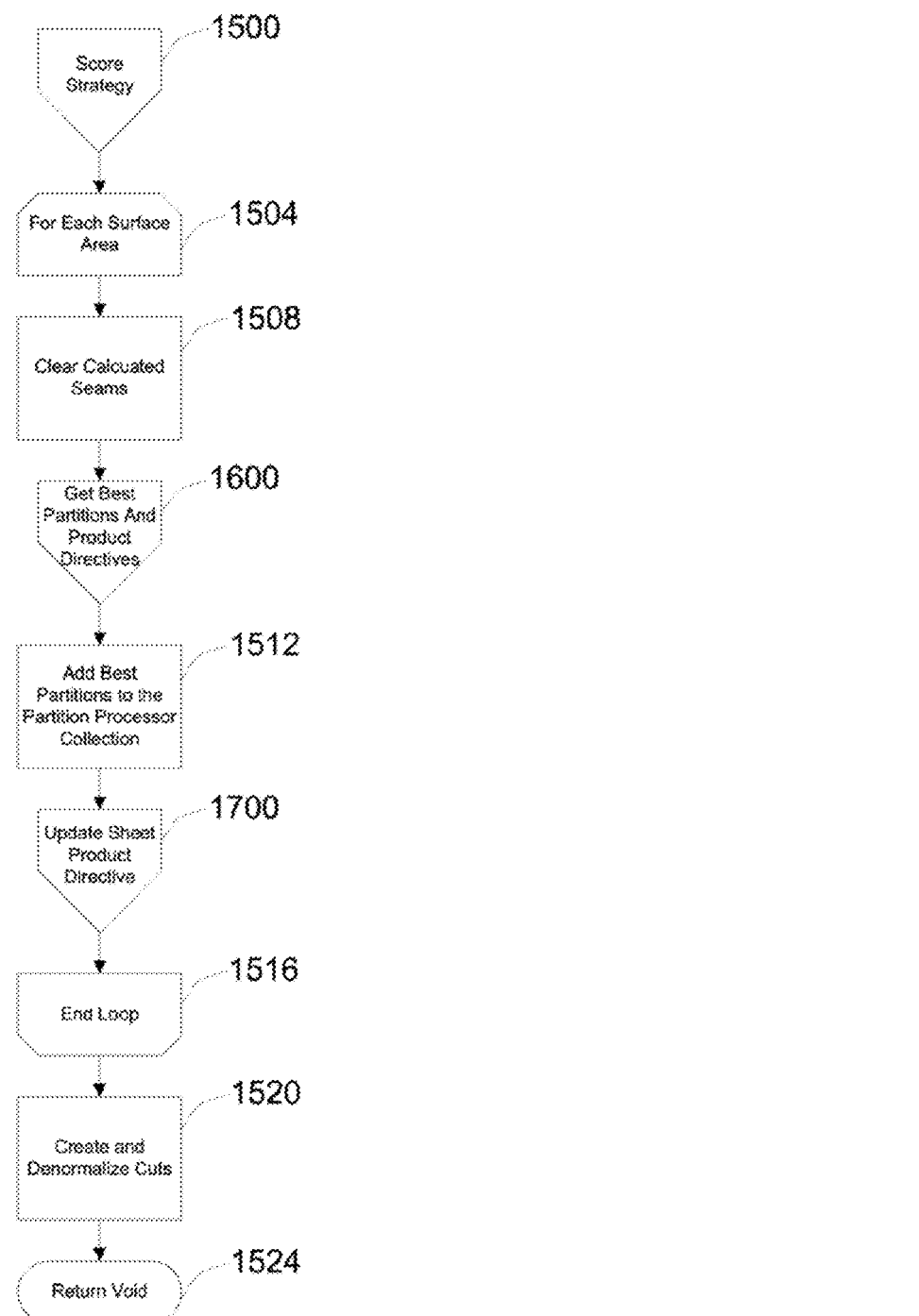

From Process Step 1400, FIG. 2N, proceed to Process Step 1404, Get the Lay Direction Directives for the Surface Areas. Proceed then to Process Step 1408, which asks "All lay Directions Unlocked?" If "no," proceed to Process Step 1412, which asks, "All Lay Directions Implicitly Locked?" If "no," proceed then to Process Step 1416, All Lay Directions Explicitly Locked?" If "no," proceed then to Process Step 1420, Throw Exception. Proceed then to Process Step 1468, Return ISurfaceCalculationStrategy. Process Step 1468 returns with the best score and ends Process Step 1400. Referring to Process Step 1408, if "yes," proceed to Process Step 1424, Get Possible Lay Directions. Proceed then to Process Step 1436, For Each Lay Direction. Proceed then to Process Step 1444 Create Surface Calc Strategy. Proceed then to Process Step 1452, Set Lay Direction for Strategy. Proceed to Process Step 1500, Score Strategy, which generates cuts.

From Process Step 1500, FIG. 2O, proceed to Process Step 1504, For Each Surface Area. Proceed then to Process Step 1508, Clear Calculated Seams. Proceed to Process Step 1600, Get Best Partitions and Product Directives.

Figure 2P:
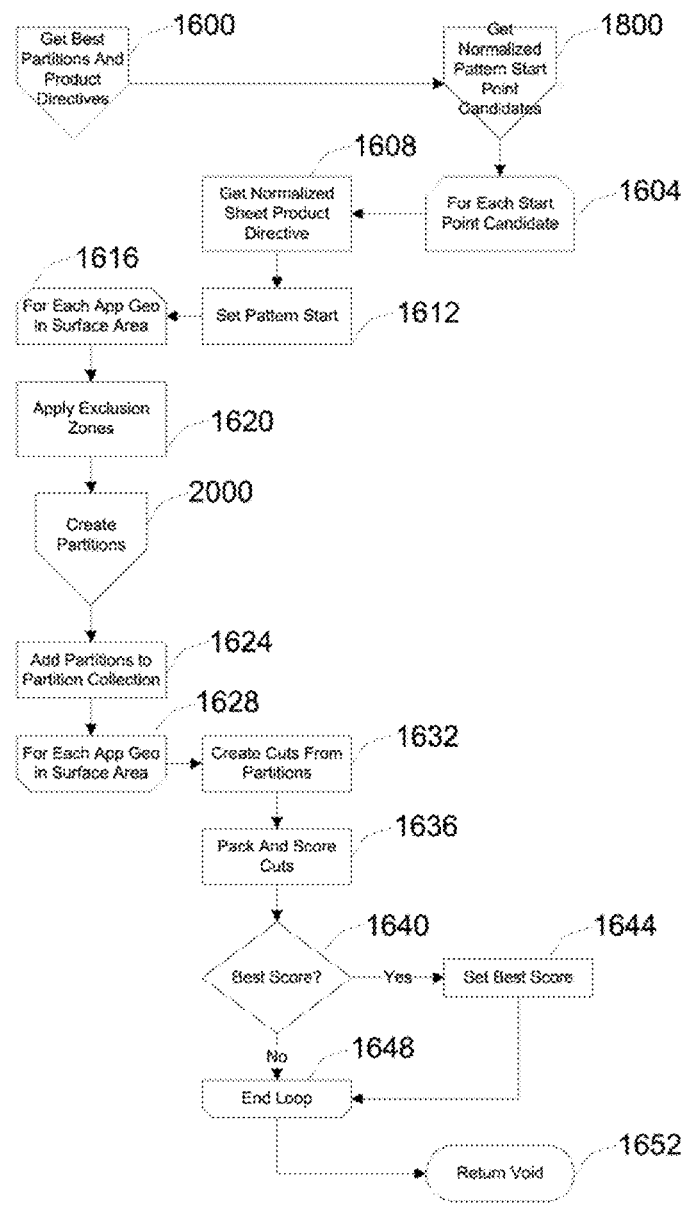

From Process Step 1600, FIG. 2P, proceed to Process Step 1800, Get Normalized Pattern Start Point Candidates. This step generates multiple start points based on traffic weight and default measurements.

Figure 2Q:
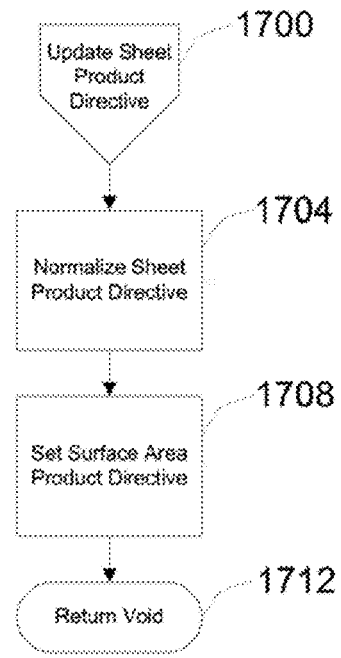
Figure 2R:
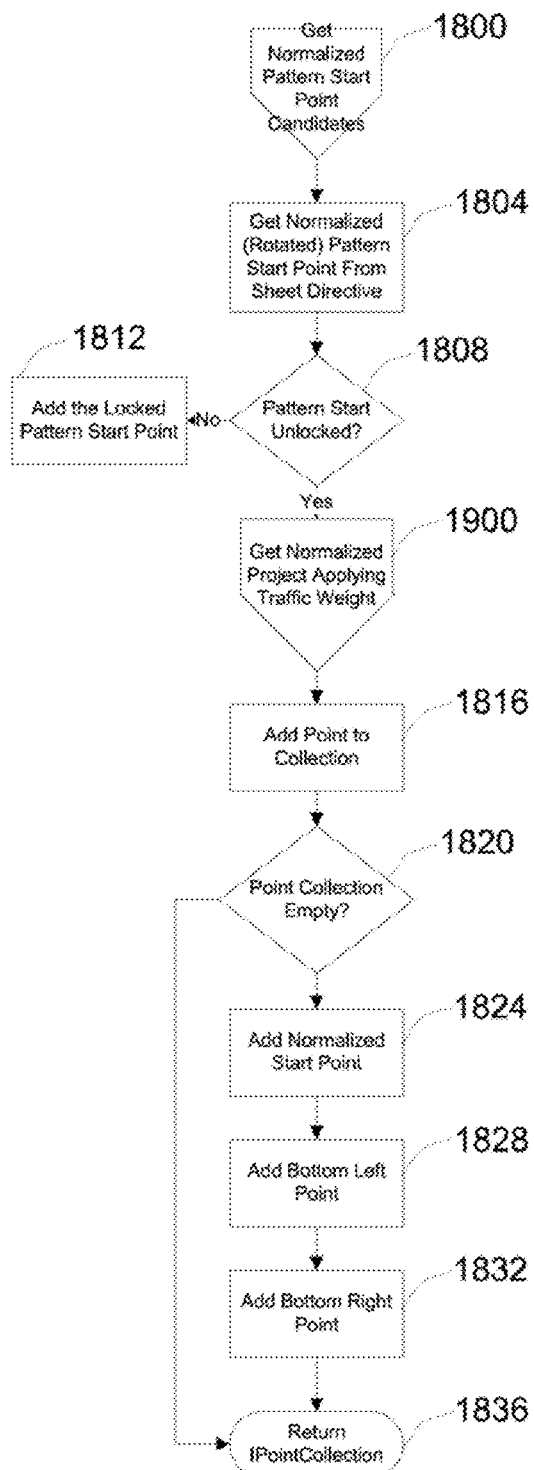

From Process Step 1800, FIG. 2R, proceed to Process Step 1804, Get Normalized (Rotated) Pattern Start Point From Sheet Directive. Proceed then to Process Step 1808, which asks the question, "Pattern Start Unlocked?" If "no," Proceed to Process Step 1812, Add the Locked Pattern Start Point. If "yes," proceed to Process Step 1900, Get Normalized Project Applying Traffic Weight. This step uses traffic weight logic.

Figure 2S:
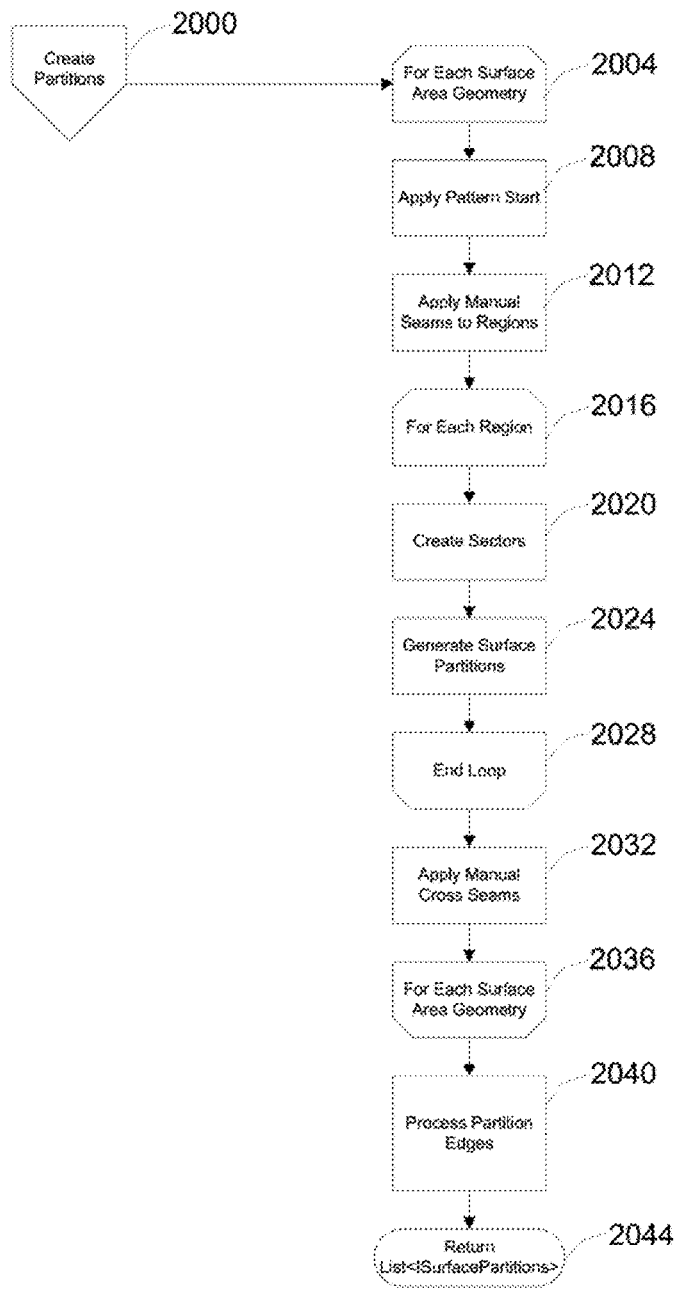
Figure 2T:
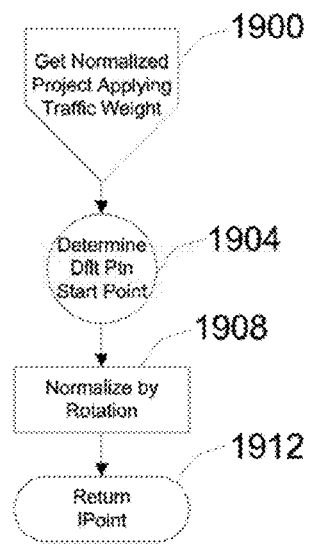

From Process Step 1900, FIG. 2T, proceed to Process Step 1904, Determine Dflt Ptn Start Point. Proceed then to Process Step 1908, Normalize by Rotation. Proceed then to Process Step 1912, Return IPoint. This step returns the optimal seam location given the traffic weight algorithm. Process Step 1912 will end Process Step 1900.

From Process Step 1900 FIG. 2R, proceed to Process Step 1816, Add Point to Collection. Proceed then to Process Step 1820, which asks the question "Point Collection Empty?" If a definitive point has been established, use it. Otherwise, set 3 candidates and let the best score win later. If "no," proceed to Process Step 1836, Return IPoint Collection, which returns collection of start point candidates. Process Step 1836 returns user to Process Step 1800. If "yes," proceed to Process Step 1824, Add Normalized Start Point. Proceed then to Process Step 1828, Add Bottom Left Point. Proceed then to Process Step 1832, Add Bottom Right Point. Proceed then to Process Step 1836, which will end Process Step 1800.

From Process Step 1800, FIG. 2P, proceed to Process Step 1604, For Each Start Point Candidate. In Process Step 1604, each start point candidate is scored. Proceed then to Process Step 1608, Get Normalized Sheet Product Directive. Proceed then to Process Step 1612, Set Pattern Start. Use the loop's current start point candidate. Proceed then to Process Step 1616, For Each App Geo in Surface Area. Proceed to Process Step 1620, Apply Exclusion Zones. In Process Step 1620, fixtures such as cabinets and other drawn objects act as flooring exclusion zones. Proceed to Process Step 2000, Create Partitions. Process Step 2000 uses pattern start, material width and business rules to split surface areas into geometries that will eventually become cuts.

From Process Step 2000, FIG. 2S, proceed to Process Step 2004, For Each Surface Area Geometry. Proceed then to Process Step 2008, Apply Pattern Start. Process Step 2008 creates regions using pattern start. Proceed then to Process Step 2012, Apply Manual Seams to Regions. Process Step 2012 splits regions with seams placed by the user. Proceed then to Process Step 2016, For Each Region. Proceed then to Process Step 2020, Create Sectors. Process Step 2020 uses the generic part attributes (i.e., material width and seam overlap) to horizontally split a region into one or more sectors.) Proceed then to Process Step 2024, Generic Surface Partitions. Process Step 2024 creates cut geometries from the sectors, including edges. Proceed then to Process Step 2028, End Loop. Proceed then to Process Step 2032, Apply Manual Cross Seams. Process Step 2032 splits cuts with cross seams placed by the user. Proceed to Process Step 2036, For Each Surface Geometry. Proceed then to Process Step 2040, Process Partition Edges. Process Step 2040 stipulates that an edge is the edge of the cut as adjusted for seams, etc. Proceed then to Process Step 2044, Return List<ISurfacePartitions>. Process Step 2044 returns the partition list and will end Process Step 2000.

From Process Step 2000, FIG. 2P, proceed to Process Step 1624, Add Partitions to Partition Collection. Proceed then to Process Step 1628, For Each App Geo in Surface Area. Proceed then to Process Step 1632, Create Cuts from Partitions. In Process Step 1632, partitions are translated into cuts, which can be processed by packers. Proceed then to Process Step 1636, Pack and Score Cuts. In Process Step 1636, cuts are packed efficiently onto a material sheet. Proceed to Process Step 1640, which asks the question "Best Score?" If "no," proceed to Process Step 1648, End Loop. If "yes," proceed to Process Step 1644, Set Best Score. In Process Step 1644 only the most efficient scenario, the one using the least amount of material, is kept. Proceed then to Process Step 1648, End Loop. Proceed to Process Step 1652, Return Void. Process Step 1652 returns the best partitions and normalized sheet directive through out parameters and will end Process Step 1600.

From Process Step 1600, FIG. 2O, proceed to Process Step 1512, Add Best Partitions to the Partition Processor Collection. Proceed then to Process Step 1700, Update Sheet Product Directive.

From Process Step 1700, FIG. 2Q, proceed to Process Step 1704, Normalize Product Directive. Process Step 1704 rotates by lay direction as required. Proceed to Process Step 1708, Set Surface Area Product Directive. Process Step 1708 assigns a product directive to the surface area. Proceed to Process Step 1712, Return Void. Process Step 1712 modifies the normalized sheet product directive, passed in by reference and will end Process Step 1700.

From Process Step 1700, FIG. 2O, proceed to Process Step 1516, End Loop. Proceed to Process Step 1520, Create and Denormalize Cuts. Process Step 1520 creates cuts from partitions and rotates the collection if necessary to create the cut. Proceed to Process Step 1524, Return Void. Process Step 1524 sets the score property and will end Process Step 1500.

From Process Step 1500, FIG. 2N, proceed to Process Step 1456, Add Strategy to Collection. Proceed then to Process Step 1460, End Loop. Proceed to Process Step 1464, Pick Best Score. Proceed then to Process Step 1468, Return ISurfaceCalculationStrategy, which will end Process Step 1400. Referring to Process Step 1412, if "yes," proceed to Process Step 1428, Create Surface Calculation Strategy. Proceed then to Process Step 1440, Get Lay Directions. Proceed then to Process Step 1448, Set Remaining Lay Directions. Proceed then to Process Step 1500, described above. Proceed then to Process Step 1468, which will end Process Step 1400. Referring to Process Step 1416, if "yes," proceed to Process Step 1432, Create Surface Calculation Strategy. Proceed then to Process Step 1500, described above. Proceed then to Process Step 1468, which will end Process Step 1400.

From Process Step 1400, FIG. 2M, proceed to Process Step 1308, Add Strategy to Proximity Group. Proceed then to Process Step 1312, For Each Proximity Group. Proceed then to Process Step 1316, Return Void. Process Step 1316 modifies the surface scenario with strategies, passed in by reference and will end Process Step 1300.

From Process Step 1300, FIG. 2F, proceed to Process Step 616, Return ISurfaceScenario. Process Step 616 returns the scenario and will end Process Step 600.

From Process Step 600, FIG. 2E, proceed to Process Step 404, Return ISurfaceScenario. Process Step 404 returns the material group's surface scenario and will end Process Step 400.

From Process Step 400, FIG. 2C, proceed to Process Step 212, Add to the Surface Scenario Collection. Proceed then to Process Step 216, For Each Material Group. Proceed then to Process Step 220, Return List<ISurfaceScenario>. Process Step 220 returns the list of generated surface scenarios and will end Process Step 200.

From Process Step 200, FIG. 2A, proceed to Process Step 24, which asks the question "No Lay Direction Conflicts?" If "no," proceed to Process Step 28, Write to Fault Log. Proceed then to Process Step 36, Return Void. Process Step 36 returns the modified estimate, passed in by reference. If "yes," proceed to Process Step 32, Create Calculator Inputs. Process Step 32 uses the list of scenarios to generate a list of calculator inputs. Proceed to Process Step 10, Execute Calculations.

From Process Step 10, FIG. 2D, proceed to Process Step 12, For Each Calculator Input. Proceed to Process Step 14, Get Calculator. Process Step 14 establishes which calculator is to be used, sheet or box goods. Proceed to Process Step 2500, Calculate. Process 2500 is the final optimization and packing for each calculator.

Figure 2U:
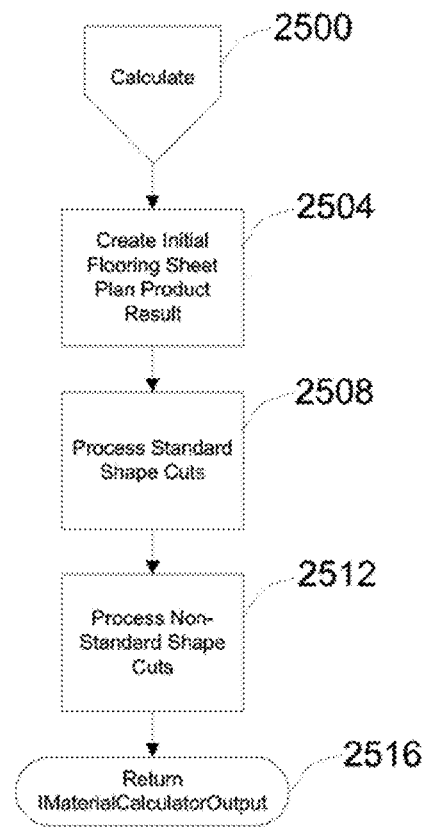

From Process Step 2500, FIG. 2U, proceed to Process Step 2504, Create Initial Flooring Sheet Plan Product Result. Process Step 2504 is the collection that holds the results of the various calculations, including the sheet with cuts. Proceed to Process Step 2508, Process Standard Shape Cuts. Process Step 2508 Processes the scenario where the product is standard, including a final pack for each surface area and tests the efficiency of head and side cross seams. Proceed to Process Step 2512, Process Non-Standard Shape Cuts. Process 2512 processes the scenario where the product is not standard, including final pack for each surface, and tests the efficiency of head and side cross seams. Proceed to Process Step 2516, Return IMaterialCalculatorOuput. Process Step 2516 returns calculator results and will end Process Step 2500.

From Process Step 2500, FIG. 2D, proceed to Process Step 18, End Loop. Proceed to Process Step 19, Return Void. Process Step 19 transforms calculator inputs and outputs to the CalculatorResultsProperty and ends Process Step 10.

From Process Step 10, FIG. 2A, proceed to Process Step 36, Return Void. Process Step 36 will Return the modified estimate passed in by reference and will end Calculation Engine.

Packer-Overview

The Packer is responsible for accepting a collection of material cuts from the Calculator and arranging them on a sheet of material, following a standard set of rules specific to the sheet good flooring industry. Such rules include, but are not limited to, preventing the overlapping of cuts on the sheet, splitting cuts up into smaller pieces or modifying a cut's orientation.

The Packer balances the antipodal objectives of both minimizing the usage of material and the time required to perform the pack. Its success in satisfying these objectives is due to its unique ability to eliminate unfeasible or inefficient packing positions by conducting very fast logical tests on a large set of permutations prior to executing the slower geometric operations necessary to complete each pack.

Cut Extraction, Normalization and Metadata Building

The cuts passed to the Packer are normalized by the CutExtractor. The normalization process attempts to reduce the number of points required to accurately describe each cut in terms of the packing requirements. Series of points that form notches in the cuts that are deemed to be insignificant to the packing process are eliminated or are replaced by a smaller number of points. In some cases, new "fit" points may be added to aid in packing oddly shaped cuts. This reduction in points is important because it reduces the number of iterations necessary to pack any given cut, thereby improving performance. During the normalization process, each cut is also standardized in terms of the order followed by the points around the cut and the order of the cut's first point.

After normalization, statistics are compiled and stored into a collection of metadata that describe the essential characteristics of each point. This metadata is used to perform the high performance logical tests. The characteristics contained in the metadata include the point type (line, inside corner or outside corner) and the incoming and outgoing direction of the lines coming into the point from the last point and emanating out of the point to the next point.

Packing

The packing algorithm is now ready to position the cuts on the material sheet. The cuts are sorted according to the packing strategy assigned to the cut collection and are evaluated in the sorted order.

Each cut is evaluated separately against the current state of the sheet, which varies as the cuts get packed into it. Metadata containing the same characteristics as the cuts is generated against the sheet's point collection so that the characteristics can be directly compared between cut points and sheet points.

High performance logical tests are conducted to determine whether the dimensions of the cut are suitable for packing into each available area of the sheet. Scenarios in which the cut's height, width or geometric area are larger than those of the sheet's area are eliminated. If these scenario tests are passed, each of the cut's points is compared logically with each of the sheet area's points in pairs to determine whether they are suitable for packing.

If the cut passes the high performance tests, then a slower, geometric fit is performed. If the cut fits into the sheet's available area without overlapping other cuts or the boundaries of the sheet, it is marked as packed and the sheet's metadata is updated.

The packing process is repeated until all cuts have been packed into the sheet.

Strategies Results

Every cut collection is packed using each of 3 sorting strategies—by height, by width and by area. The strategy that yields the best results (the least material usage) is deemed the winner. The winner is repackaged into a PackOutput cut collection and is returned to the Calculator.

Turning Now to FIG. 3, there is shown a flow chart of the packing operation and system. Begin with Process Step 6000, CutPackGroupRunner.Pack( ), FIG. 3A. In Process Step 6000 the calculator sends a PackInput Collection to the Packer. Proceed to Process Step 6004, which asks the question "Cuts to Pack?" If "no," proceed to Process Step 6008, Throw Error. Proceed then to Process Step 6020, Return IPackOutput. Process Step 6020 returns the most optimal packing run and ends process. If "yes," proceed to Process Step 6012, which asks the question, ">1 Cut?" If "no," proceed to Process Step 6016, PackOneCut. Proceed then to Process Step 6020, which ends process. If "yes," proceed to Process Step 6100, PackCuts.

Figure 3A:
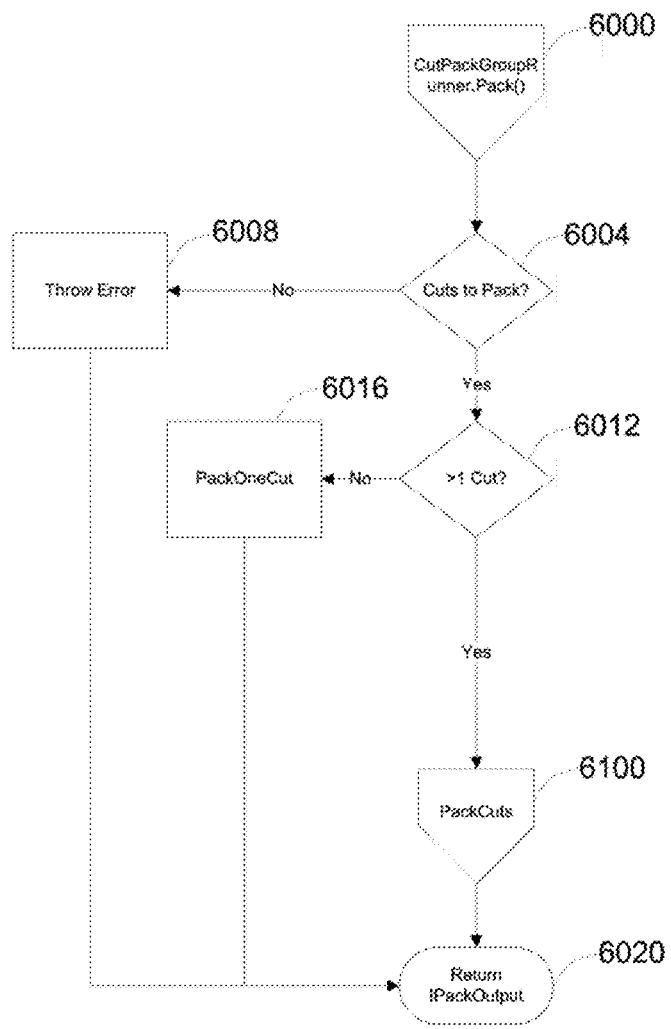
FIG. 3A through 3N is a flow chart showing a software program for a packer according to a preferred embodiment of the invention.
Figure 3B:
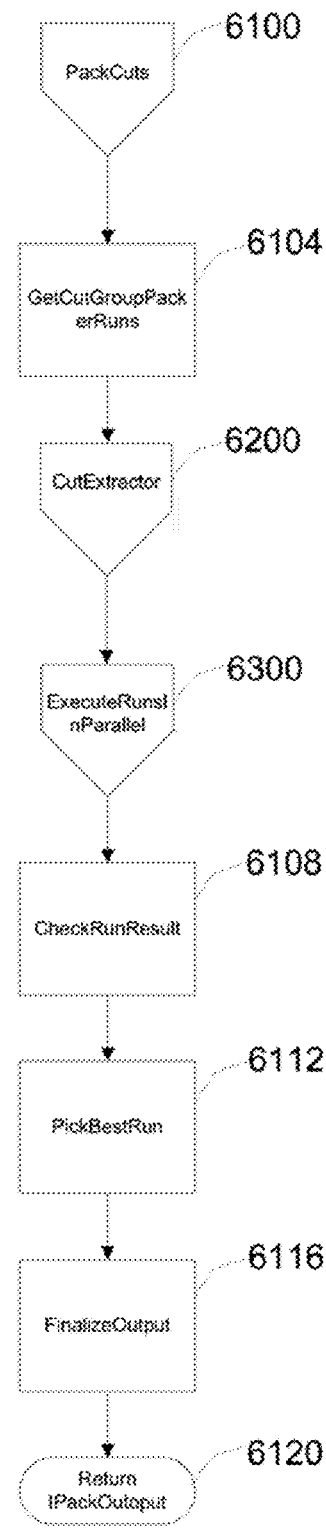

From Process Step 6100, FIG. 3B, proceed to Process Step 6104, GetCutGroupPackerRuns. Process Step 6104 constructs 3 sets of runs sorted in unique order. Proceed then to Process Step 6200, Extract Cuts.

Figure 3C:
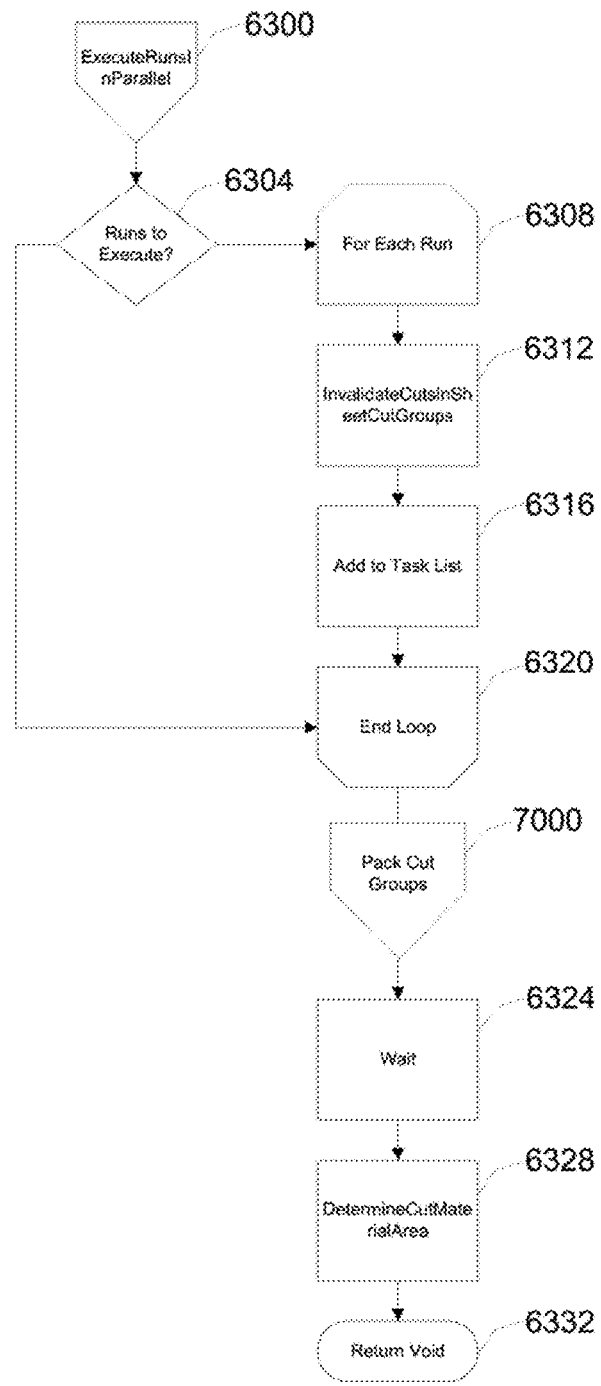
Figure 3D:
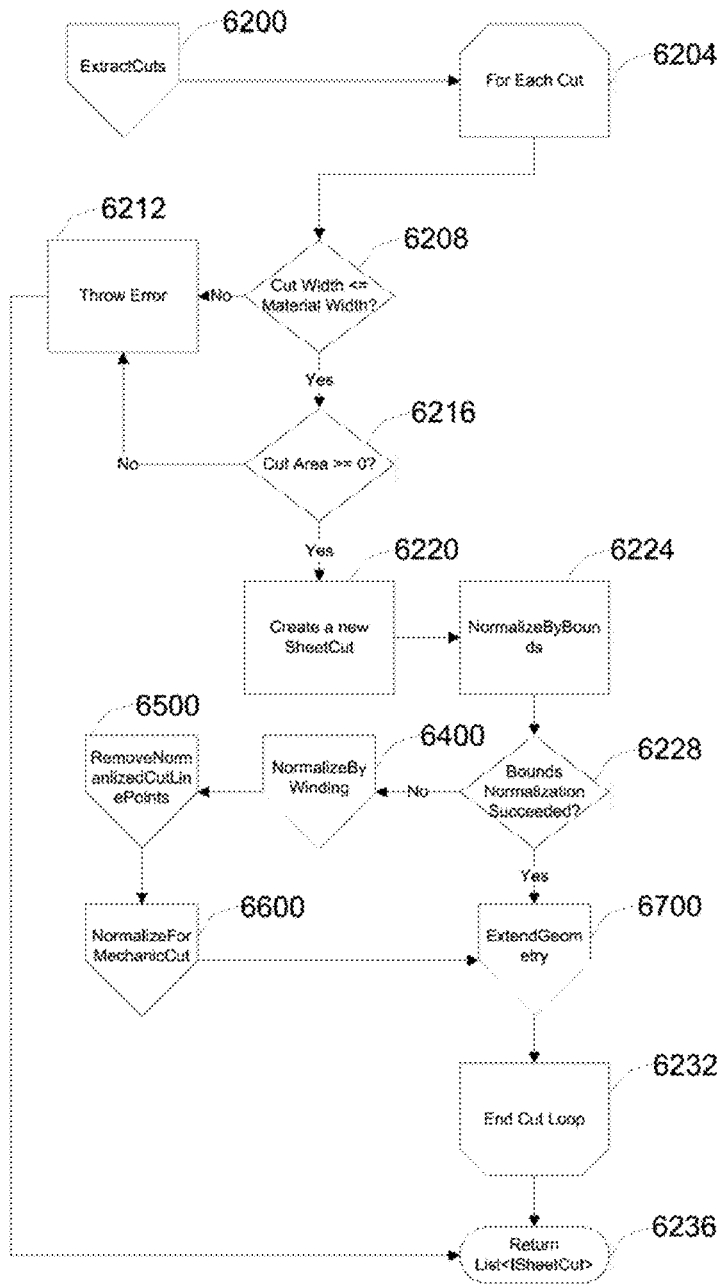

From Process Step 6200, FIG. 3D, proceed to Process Step 6204, For Each Cut. In Process Step 6204, the calculator cut collection must be translated to one that the packer can understand. This routine loops through each calculator cut and creates an analogous packer cut. Proceed then to Process Step 6208, which asks the question, "Cut Width<=Material Width?" Process Step 6208 validates that the calculator has correctly limited the width of every cut to be no more than the width of the material. If "no," proceed then to Process Step 6212, Throw Error. Proceed then to Process Step 6236, Return List<ISheetCut>. Process Step 6236 returns the list of extracted sheet cuts given an IPackInput and the material width and ends Process Step 6200. Referring back to Process Step 6208, if "yes," proceed then to Process Step 6216 which asks the question, "Cut Area>=0?" If "no," proceed then to Process Step 6212, then to Process Step 6236 which ends Process Step 6200. If "yes," proceed to Process Step 6220, Create a new SheetCut. In Process Step 6220 a SheetCut is the base entity required by the packer. Proceed then to Process Step 6224, NormalizeByBounds. In Process Step 6224, if the cut can be described using a rectangle (4 points) without introducing too much waste, do so. This optimizes performance by minimizing the number of points to be tested for potential fit matches. Proceed then to Process Step 6228, which asks the question "Bounds Normalization Succeeded?" In Process Step 6228 If NormalizeByBounds fails, proceed through more complex and time consuming algorithms to simplify the cut's geometry to optimize packing. If "no," proceed to Process Step 6400, NormalizeByWinding.

Figure 3E:
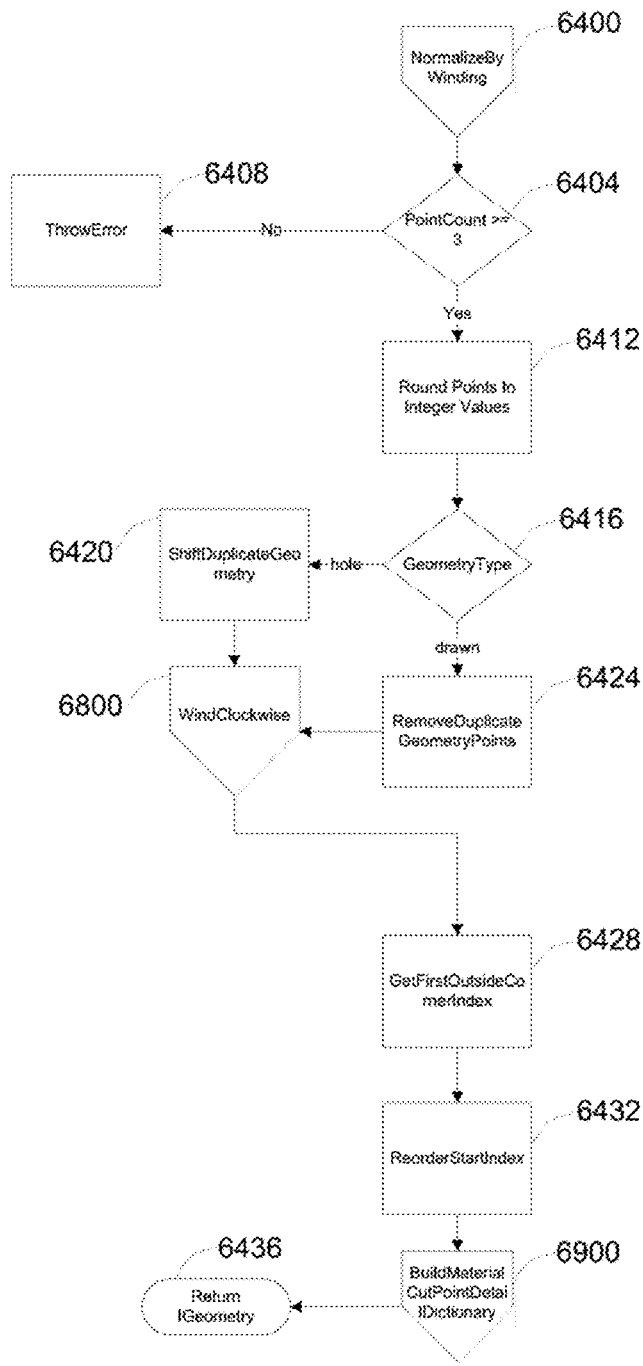

From Process Step 6400, FIG. 3E, proceed then to Process Step 6404, which asks the question, "PointCount>=3." In Process Step 6404, cuts must have at least 3 pts to have area>0. Proceed to Process Step 6408, Throw Error. If "yes," proceed to Process Step 6412, Round Points to Integer Values. In Process Step 6412 points that could be rounded to the same integers as other points tend to cause errors, so round all of the points to their integer values before attempting to create the point dictionary. Duplicate points will be dropped. Proceed then to Process Step 6416, Geometry Type, which asks whether the geometry type is drawn or hole. Geometry types are drawn and hole. A hole is a result of a WPF operation between 2 geometries that results in a hole. If "hole," proceed to Process Step 6420, ShiftDuplicateGeometry. Proceed then to Process Step 6800, WindClockwise. In Process Step 6800, the point collection is ordered clockwise to ensure that the results of the algorithms are consistent.

Figure 3F:
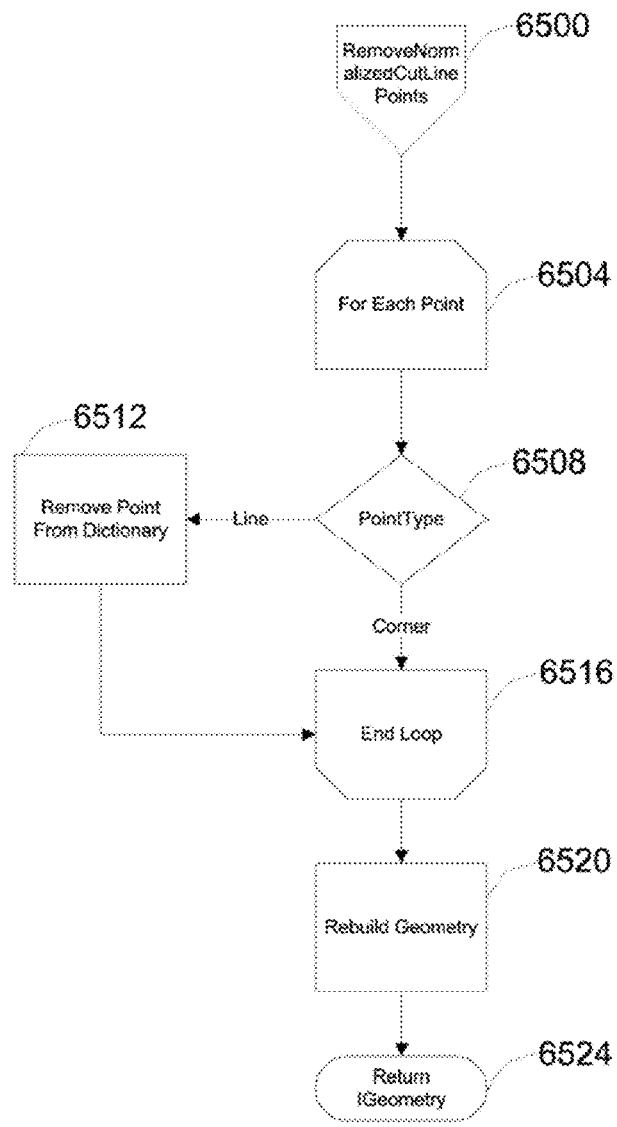
Figure 3G:
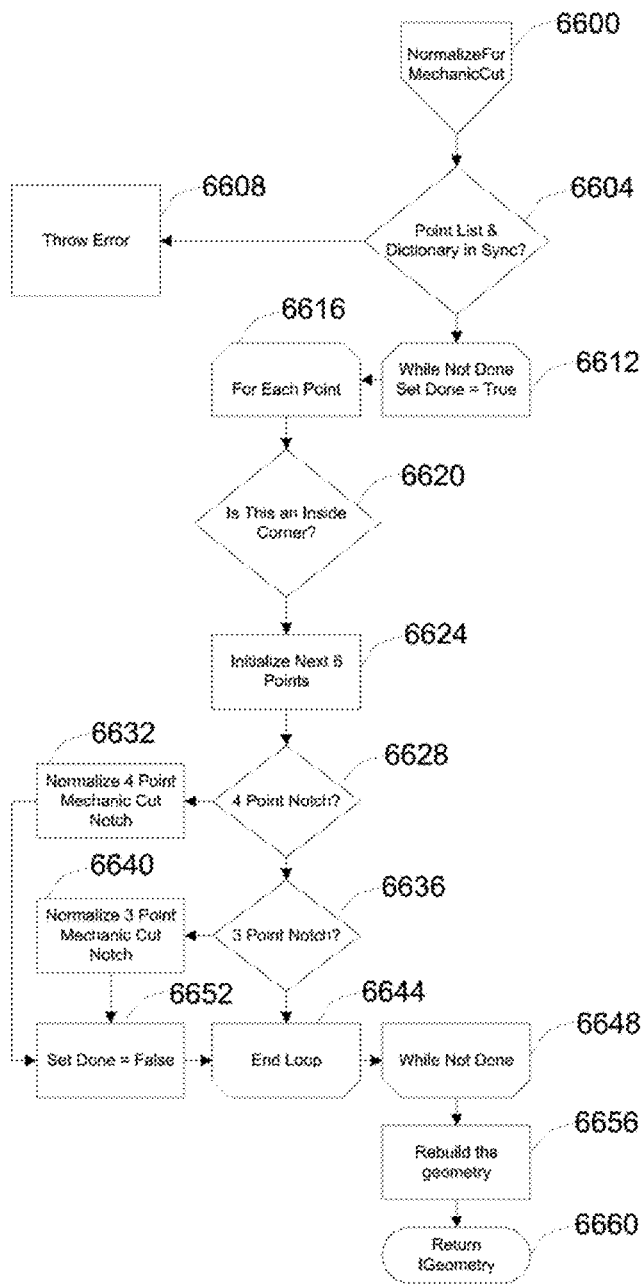
Figure 3H:
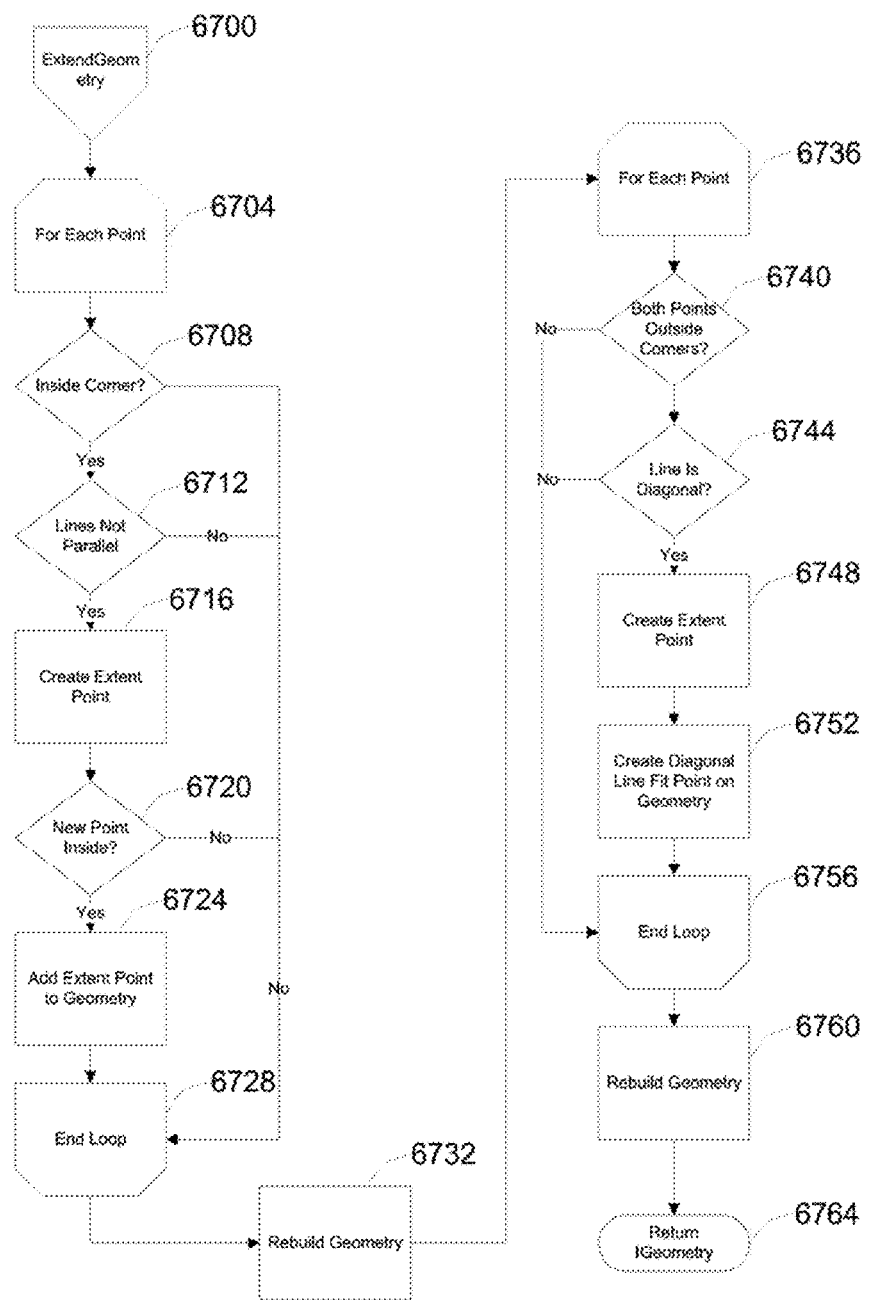
Figure 3I:
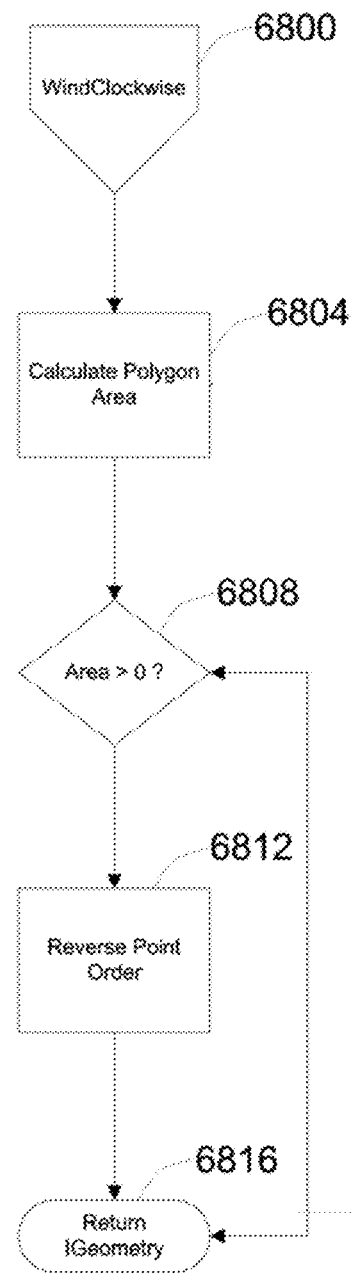

From Process Step 6800, FIG. 3I, proceed to Process Step 6804, Calculate Polygon Area. Process Step 6804 traverses the points of a polygon and calculates its area based on the progression of their x,y values. If the area is negative, the polygon points represent a counter clockwise progression, in which case the point order must be reversed. Proceed then to Process Step 6808, which asks the question, "Area>0?" If the area is less than zero, its points are wound counter clockwise. If "no," Proceed to Process Step 6818, Return IGeometry, which returns the cut's geometry with its points wound clockwise and ends Process Step 6800. If "yes," proceed to Process Step 6812, Reverse Point Order. Proceed to Process Step 6818, which will end Process Step 6800.

Referring to Process Step 6800, FIG. 3E, proceed then to Process Step 6428, GetFirstOutsideCornerIndex. In Process Step 6428, the process of efficiently matching points depends, in part, on identifying the leftmost, uppermost point which is also an outside corner. Proceed then to Process Step 6432, ReorderStartIndex. Process Step 6432 reorders the points to that the FirstOutsideCorner is the first point. Proceed then to Process Step 6900, BuildMaterialCutPointDetailDictionary. Process Step 6900 populates a repository of metadata that describes a cut's point collection, including x, y coordinates, point types, whether points represent inside or outside corners and whether the point is drawn or has been calculated. This metadata is used to optimize the packing process for waste and performance.

Figure 3J:
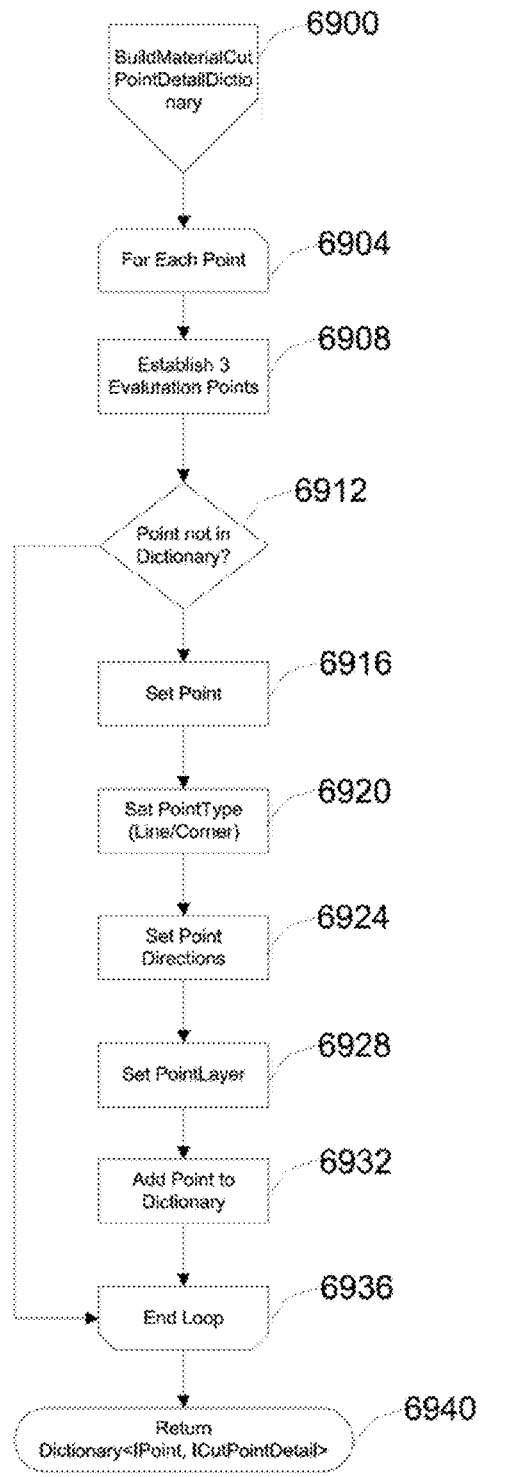

From Process 6900, FIG. 3J, proceed to Process Step 6904, For Each Point. Proceed then to Process Step 6908, Establish Evaluation Points. In Process Step 6908 some of a point's metadata is established as a function of the point's geometric relationship to the point before it and after it. Proceed then to Process Step 6912, which asks the question, "Point not in Dictionary?" If "no," proceed to Process Step 6936, End Loop. Proceed then to Process Step 6940, Return Dictionary<IPoint, ICutPointDetail>, which returns a dictionary of points and their Cut Point Detail and ends Process Step 6900. Referring to Process Step 6912, if "yes," proceed to Process Step 6916, Set Point. Proceed to Process Step 6920, Set Point Type (Line/Corner) A point is either in line between its 2 evaluation points or changes the slope of its incoming and outgoing lines, thereby forming a corner. Proceed to Process Step 6924, Set Point Directions. Process Step 6924 determines whether the corner is an inside or outside corner. Proceed to Process Step 6928, Set PointLayer. In Process Step 6928 the cuts are drawn for ExtractCut call. Proceed to Process Step 6932, Add Point to Dictionary. Proceed to Process Step 6936, End Loop. Proceed to Process Step 6940, Return Dictionary<IPoint, ICutPointDetail>, which will end Process Step 6900.

From Process Step 6900, FIG. 3E, proceed to Process Step 6436, Return IGeometry, which returns the geometry of the cut to the modified cut's point detail dictionary, passed in by reference and ends Process Step 6400. Referring to Process Step 6416, if "drawn," proceed to Process Step 6424, RemoveDuplicateGeometryPoints. In Process Step 6424, if 2 or more points share the same coordinates, the first is kept and the rest are thrown away. Proceed then to Process Step 6800, described above. Proceed then to Process Step 6428. Proceed to Process Step 6432. Proceed to Process Step 6900, described above. Proceed to Process Step 6436, which will end Process Step 6400.

Referring to Process Step 6400, FIG. 3D, Proceed to Process Step 6500, RemoveNormalizedCutLinePoints.

From Process Step 6500, FIG. 3F, proceed to Process Step 6504, For Each point. Proceed to Process Step 6508, which asks whether the point type is a line or corner. In Process Step 6508, attempting to match line points (as opposed to corner points) in cuts tends to reduce the efficiency of packing operations, so remove the line points. If "line" proceed to Process Step 6512, Remove Point From Dictionary. Proceed to Process Step 6516, End Loop. Proceed to Process Step 6520, ReBuild Geometry. Process Step 6520 rebuilds the geometry from the points that represent corners only, not line points. Proceed to Process Step 6524, Return IGeometry, which returns the new cut's new geometry and modified Point Detail Dictionary, passed in by reference and ends Process Step 6500. Referring to Process Step 6508, if "corner," proceed to Process Step 6516, described above. Proceed to Process Step 6520, described above. Proceed to Process Step 6524, which will end Process Step 6500.

Referring to Process Step 6500, FIG. 3D, proceed to Process Step 6600, NormalizeForMechanicCut.

From Process Step 6600, FIG. 3G, proceed to Process Step 6604, which asks the question, "Point List & Dictionary in Sync?" If "no," proceed to Process Step 6608, Throw Error. If "yes," proceed to Process Step 6612, While Not Done Set Done=True. Proceed to Process Step 6616, For Each Point. Proceed to Process Step 6620, which asks the question, "Is This an Inside Corner? Only inside corners are candidates for reduction because they represent "lack of material." The real material represented by outside corners must be preserved. Otherwise, not enough material would be allocated for the job. Proceed to Process Step 6624, Initialize Next 6 Points. Up to six points must be tracked at any given point so that substitute points can be established for the normalization. Proceed to Process Step 6628, which asks the question, "4 Point Notch?" If "no," proceed to Process Step 6636, which asks the question "3 Point Notch?" Process Step 6636 eliminates a typically corner notch in the cut by eliminating all 3 points and substituting the point formed by the intersection of the lines coming in to an out of the notch. If "no," proceed to Process Step 6644, End Loop. Referring to Process Step 6628, if "yes," proceed to Process Step 6632, Normalize 4 Point Mechanic Cut Notch. Proceed to Process Step 6652, Set Done=False. Proceed to Process Step 6644, described above. Referring to Process Step 6636, If "yes," proceed to Process Step 6640, Normalize 3 Point Mechanic Cut Notch. Proceed to Process Step 6652, Set Done=False. Proceed to Process Step 6644, End Loop. Proceed to Process Step 6648, While Not Done. Proceed to Process Step 6656, Rebuild the geometry. Proceed to Process Step 6660, Return IGeometry. Process Step 6660 will return the cut's new geometry and modified Point Detail Dictionary, passed in by reference and will end Process Step 6600.

From Process Step 6660, FIG. 3D, Proceed to Process Step 6700, ExtendGeometry.

From Process 6700, FIG. 3H, proceed to Process Step 6704, For Each Cut. Similar to the mechanic notch, except that this routine adds extra points instead of removing/substituting for unnecessary ones. When inside corners are found, this routine potentially adds a point at the intersection of the incoming and outgoing lines of the notch formed by point 0+1 and 3+4. Proceed then to Process Step 6708, which asks the question, "Inside Corner?" If "no," proceed to Process Step 6728, End Loop. If "yes," proceed to Process Step 6712, which asks the question, "Lines Not Parallel?" If "no," proceed to Process Step 6728, End Loop. If "yes," proceed to Process Step 6716, Create Extent Point. Proceed to Process Step 6720, which asks the question, "New Point Inside?" If "no," proceed to Process Step 6728, End Loop. If "yes," proceed to Process Step 6724, Add Extent Point to Geometry. Proceed to Process Step 6728, End Loop. Proceed to Process Step 6732, Rebuild Geometry. Proceed to Process Step 6736, For Each Point. Similar to the mechanic notch, this routine recognizes a condition where 4 points form a diagonal tabbed notch and adds a point at the intersection of the incoming and outgoing lines formed by points 0+1 and 2+3. Proceed to Process Step 6740, which asks the question, "Both Points Outside Corner?" If "no," Proceed to Process Step 6756, End Loop. If "yes," proceed to Process Step 6744, which asks the question, "Line is Diagonal?" If "no," proceed to Process Step 6756, End Loop. If "yes," proceed to Process Step 6748, Create Extent Point. Proceed to Process Step 6752 Create Diagonal Line Fit Point on Geometry. If the diagonal line is long enough, a fit point along the diagonal would be required as a potential matching point. Otherwise, too much waste may result. Proceed to Process Step 6756, End Loop. Proceed to Process Step 6760, Rebuild Geometry. Proceed to Process Step 6764, Return IGeometry, which returns the cut's new geometry and modified Point Detail Dictionary, passed in by reference, and will end Process Step 6700.

Referring to Process Step 6700, FIG. 3D, proceed to Process Step 6232, End Cut Loop. Proceed to Process Step 6236, Return List<ISheetCut>, which will end Process Step 6200.

Referring to Process Step 6200, FIG. 3B, proceed to Process Step 6300, ExecuteRunsInParallel. Process Step 6300 executes the packer against each of the 3 runs.

From Process Step 6300, FIG. 3C, proceed to Process Step 6304, which asks the question, "Runs to Execute?" If "no," proceed to Process Step 6320, End Loop. If "yes," proceed to Process Step 6308, For Each Run. Proceed to Process Step 6312, InvalidateCutsInSheetCutGroups. Process Step 6312 will initialize each of the cuts in the group. Proceed to Process Step 6316, Add to Task List. Process Step 6316 will add the run to the Task List, specifying the run's SheetCutGroupPacker.PackCutGroup method as the task to run. Proceed to Process Step 6320, End Loop. Proceed to Process Step 7000, Pack Cup Groups. Process Step 7000 queue's up the tasks to be executed.

Figure 3K:
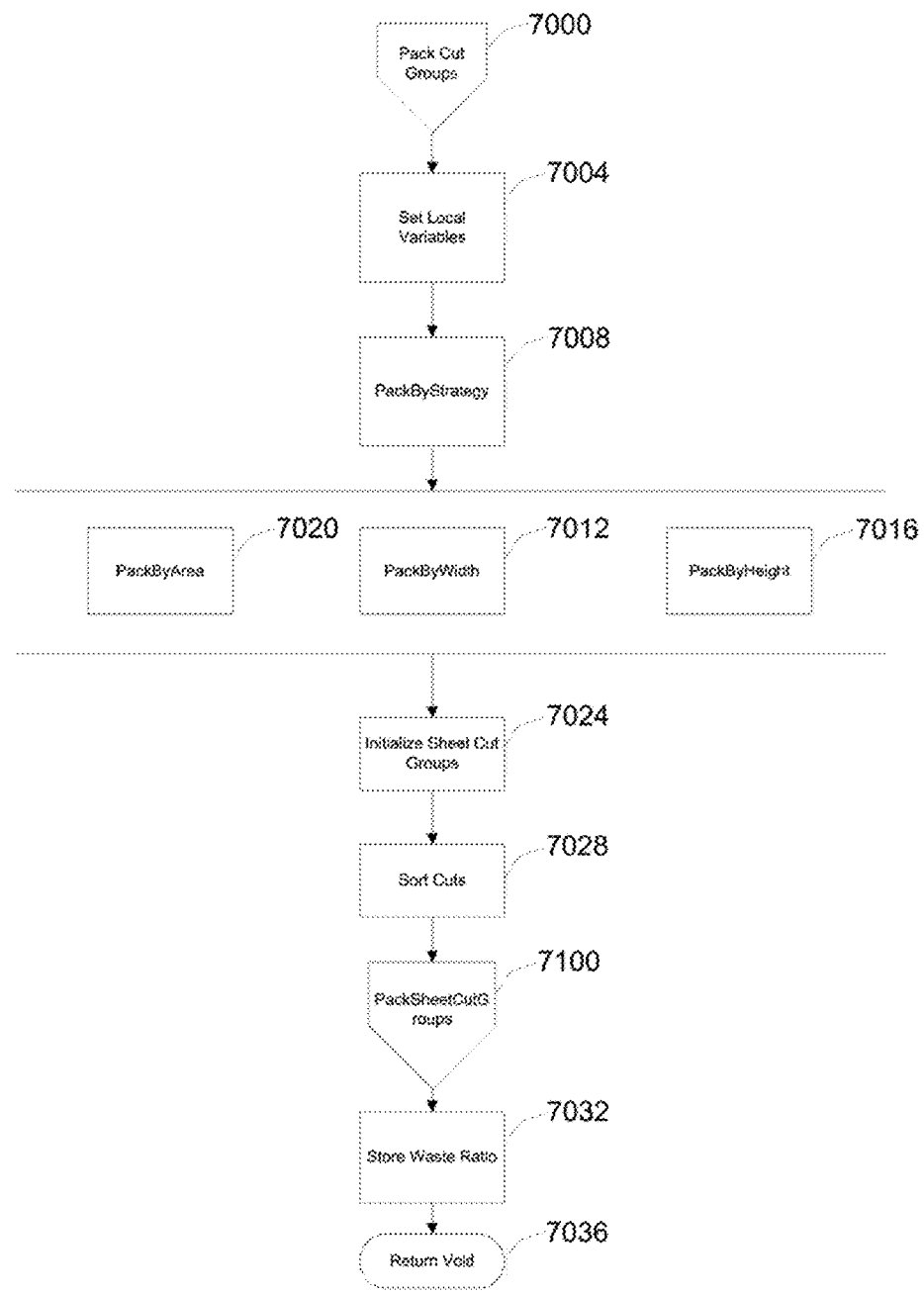

From Process Step 7000, FIG. 3K, proceed to Process Step 7004, Set Local Variables. Process Step 7000 determines material width and minimum width. Proceed to Process Step 7008, PackByStrategy. Process Step 7008 uses the run's designated sorting algorithm to pack it. From Process Step 7008, choose one of the following: a) Process Step 7020, PackByArea, b) Process Step 7012, PackByWidth, c) Process Step 7016, PackByHeight. From Process Steps 7020, 7012, and 7016, proceed to Process Step 7024, Initialize Sheet Cut Groups. Process Step 7024 marks the groups as unpacked and repositions them at x,y coordinate 0.0. Proceed to Process Step 7028, Sort Cuts. Process Step 7028 sorts the cuts according to the packing strategy. Proceed to Process Step 7100, PackSheetCutGroups.

Figure 3L:
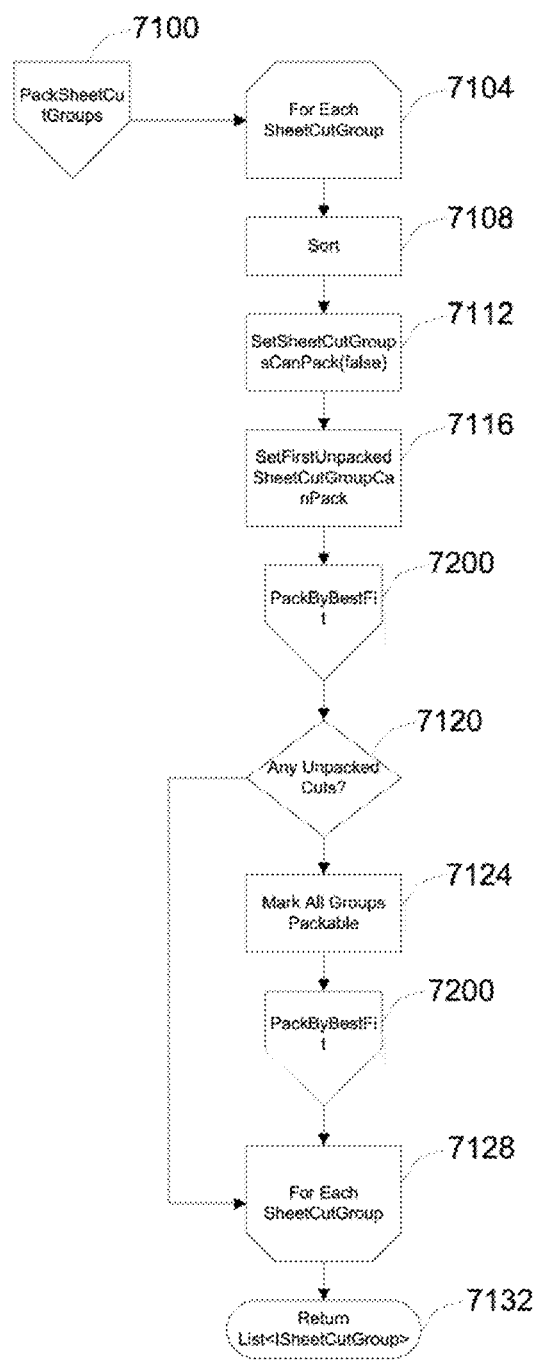

From Process Step 7100, FIG. 3L, proceed to Process Step 7104, For Each SheetCutGroup. In Process Step 7104 all cuts must be packed. Proceed to Process Step 7108, Sort. Process Step 7108 Sorts according to the packing strategy. Proceed to Process Step 7112, SetSheetCutGroupsCanPack(false). In Process Step 7112, the packer tightly controls which cuts are eligible for packing at a given time. Proceed to Process Step 7116, SetFirstUnpackedSheetCutGroupCanPack. In Process Step 7116, the first unpacked cut in the sorted order will be tested first. Proceed to Process Step 7200, PackByBestFit. Process 7200 is the actual packing routine.

Figure 3M:
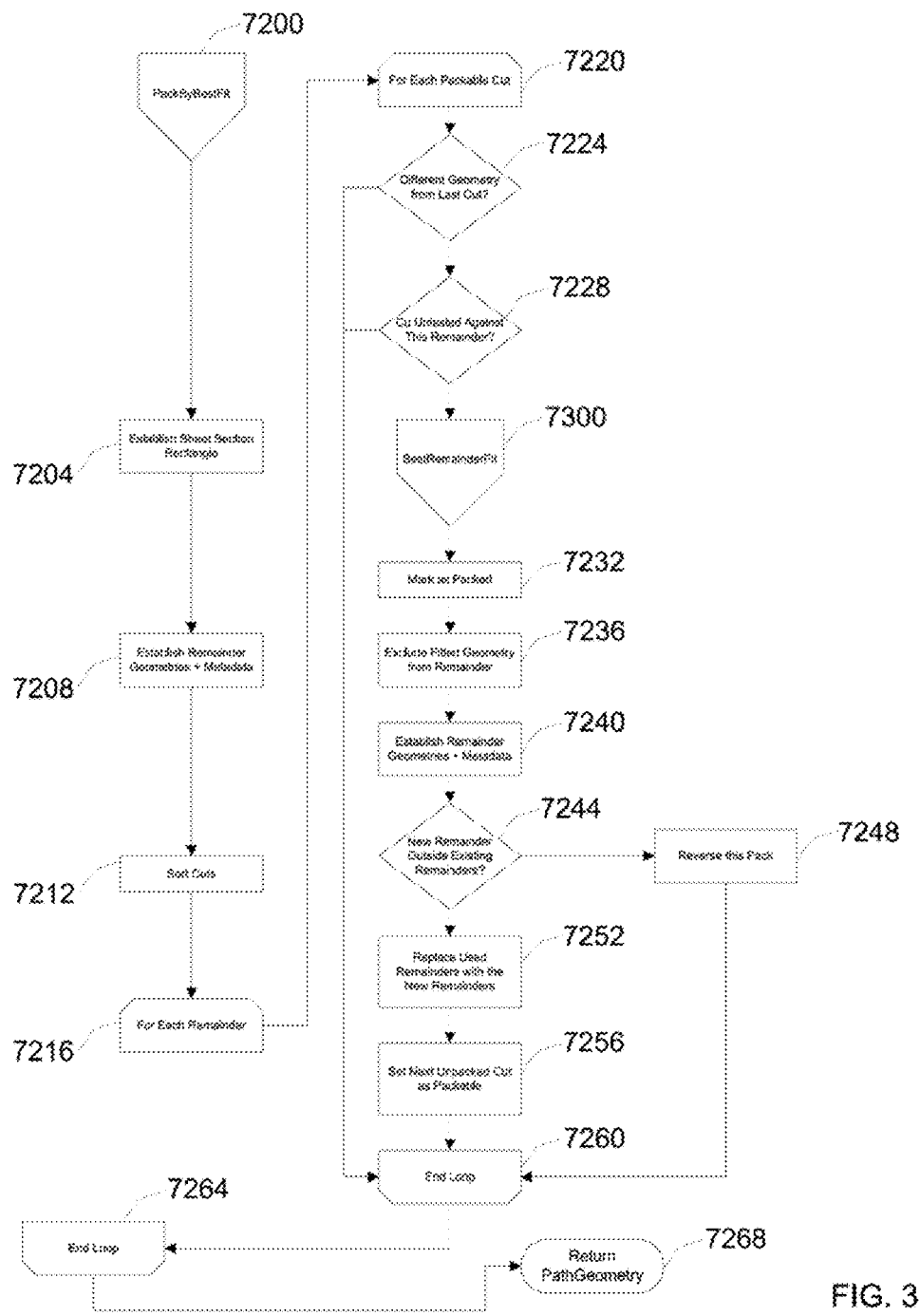

From Process Step 7200, FIG. 3M, proceed to Process Step 7204, Establish Sheet Section Rectangle. Process Step 7204 establishes a sliding section of the sheet outside of which cuts are no longer tested. Proceed to Process Step 7208, Establish Remainder Geometries+Metadata. In Process Step 7208 remainders are geometrically equivalent to cuts. Their metadata are compared to determine their potential compatibility for fitting before the fit is tested. Proceed to Process Step 7212, Sort Cuts. Proceed to Process Step 7216, For Each Remainder. Proceed to Process Step 7220, For Each Packable Cut. Proceed to Process Step 7224, which asks the question "Different Geometry from Last Cut?" Don't repeat tests that have been attempted previously. If "no," proceed to Process Step 7260, End Loop. If "yes," proceed to Process Step 7228, which asks the question, Cut Untested Against This Remainder?" If "no," proceed to Process Step 7260, End Loop. If "yes," proceed to Process Step 7300, Best Remainder Fit. Process Step 7300 fits a cut into the given geometry.

Figure 3N:
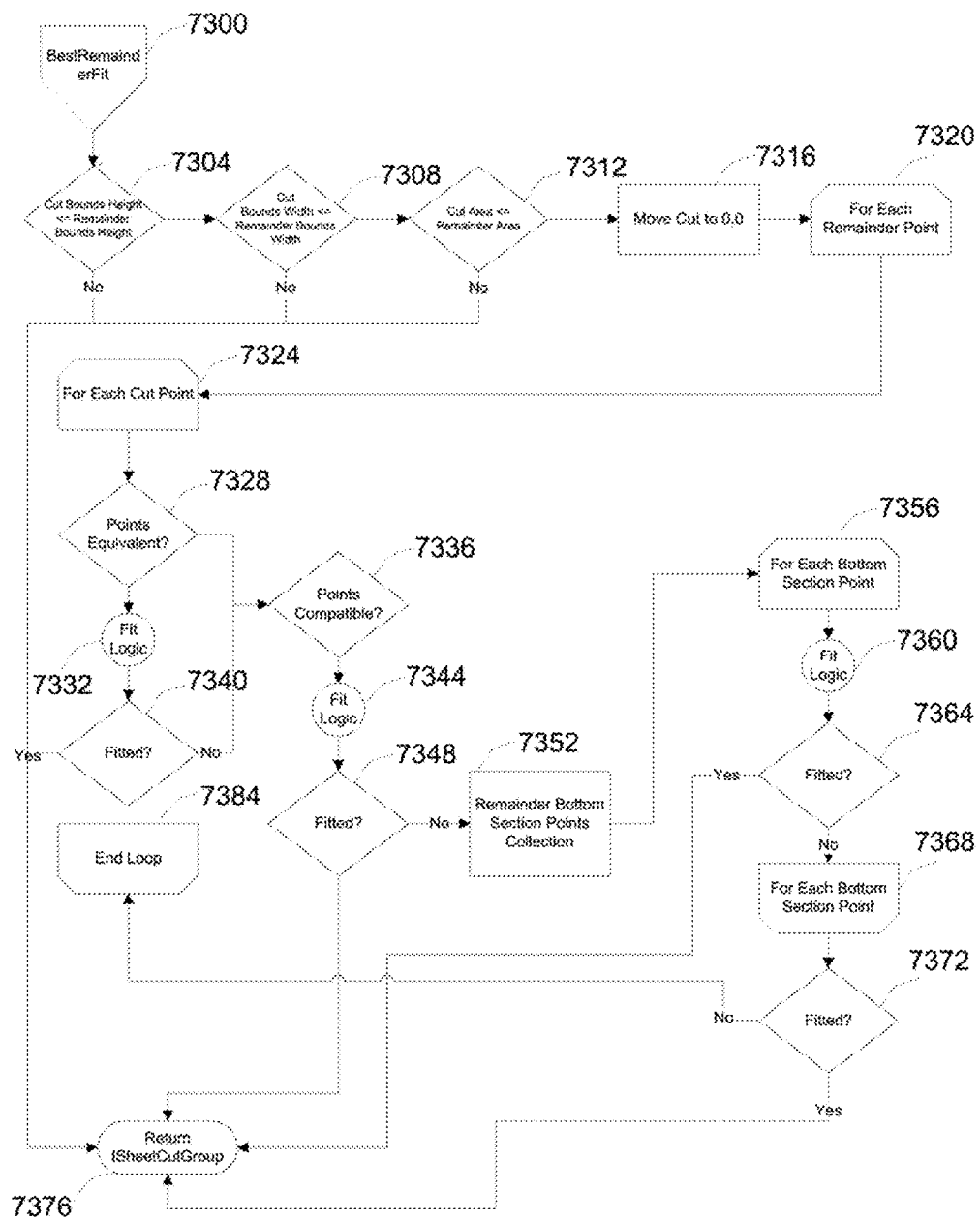

From Process Step 7300, FIG. 3N, proceed to Process Step 7304, which asks the question, "Cut Counts Height<=Remainder Bounds Height?" Fits that can be predicted to be geometrically unfeasible are thrown out immediately. If "no," proceed to Process Step 7376, Return ISheetGroup, which will end Process Step 7300. If "yes," proceed to Process Step 7308, which asks the question, "Cut Bounds Width<=Remainder Bounds Width?" Fits that can be predicted to be geometrically unfeasible are thrown out immediately. If "no," proceed to Process Step 7376, Return ISheetCutGroup, which will end Process Step 7300. If "yes," proceed to Process Step 7312, which asks the question, "Cut Area<=Remainder Area?" Fits that can be predicted to be geometrically unfeasible are thrown out immediately If "no," proceed to Process Step 7376, Return ISheetCutGroup, which will end Process Step 7300. If "yes," proceed to Process Step 7316, Move Cut to 0,0. Proceed to Process Step 7320, For Each Remainder Point. Proceed to Process Step 7324, For Each Cut Point. Proceed to Process Step 7328, which asks the question, "Points Equivalent?" Points must possess equivalent point types and directions. If "yes," proceed to Process Step 7332, Fit Logic. Proceed to Process Step 7340 which asks the question, "Fitted?" If "yes," proceed to Process Step 7376, Return ISheetCutGroup, which will end Process Step 7300. Referring now to Process Steps 7328 and 7340, if "no," proceed to Process Step 7336, which asks the question, "Points Compatible?" Some combinations of opposite point types and directions are candidates for fitting. If "yes," proceed to Process Step 7344, Fit Logic. Proceed to Process Step 7348, which asks the question, "Fitted?" If "yes," proceed to Process Step 7376, Return ISheetCutGroup, which will end Process Step 7300. Referring to Process Steps 7336 and 7348, if "no," proceed to Process Step 7352, Remainder Bottom Section Points Collection. Proceed to Process Step 7356, For Each Bottom Section Point. If a cut can't be fitted to any of the remainder geometries, try to place it at the bottom of the sheet. Proceed to Process Step 7360, Fit Logic. Proceed to Process Step 7364, which asks the question, "Fitted?" If "yes," proceed to Process Step 7376, Return ISheetCutGroup, which will end Process Step 7300. If "no," proceed to Process Step 7368, For Each Bottom Section Point. Proceed to Process Step 7372, which asks the question, "Fitted?" If "no," proceed to Process Step 7384, End Loop. If "yes," proceed to Process Step 7376, Return ISheetCutGroup, which will end Process Step 7300.

From Process Step 7300, FIG. 3M, proceed to Process Step 7232, Mark as Packed. Cuts are only packed once. Proceed to Process Step 7236, Exclude Fitted Geometry from Remainder. Cut out a new remainder with the cut's geometry. Proceed to Process Step 7240, establish Remainder Geometries+ Metadata. Adjust the remainder geometries+metadata for the new remainder. Proceed to Process Step 7244, which asks the question, "New Remainder Outside Existing Remainder?" If "no," proceed to Process Step 7248, Reverse this Pack. The fitting failed the validation. Proceed to Process Step 7260, End Loop. If "yes," proceed to Process Step 7252, Replace Used Remainders with the New Remainders. After fitting a cut into a remainder, update the remainders for the next fit attempt. Proceed to Process Step 7256, Set Next Unpacked Cut as Packable. Set up next cut to be packed in the next loop iteration. Proceed to Process Step 7260, End Loop. Proceed to Process Step 7264, End Loop. Proceed to Process Step 7268, ReturnPathGeometry. Process Step 7268 returns a PathGeometry and the modified Sheet Cut Group list, passed in by reference and will end Process Step 7200.

From Process Step 7200, FIG. 3L, proceed to Process Step 7120, which asks the question, "Any Unpacked Cuts?" If "no," proceed to Process Step 7128, For Each SheetCutGroup. Proceed to Process Step 7132, Return List<ISheetCutGroup>. If "yes," proceed to Process Step 7124, Mark All Groups Packable. The rest of the cuts will be tested for fitting in the holes remaining after the previous pack, so they are marked as packable. Proceed to Process Step 7200, described above. Proceed to Process Step 7128, For Each SheetCutGroup. Proceed to Process Step 7132, Return List<ISheetCutGroup>. Process Step 7128 returns the list of packed Sheet Cut Groups and will end Process Step 7100.

From Process Step 7100, FIG. 3K, proceed to Process Step 7032, Store Waste Ratio. Proceed to Process Step 7036, Return Void. Process Step 7036 returns the packed Sheet Cut Groups list, passed in by reference and will end Process Step 7000.

From Process Step 7000, FIG. 3C, proceed to Process Step 6324, Wait. Wait for the results. Proceed to Process Step 6328, DetermineCutMaterialArea. Process Step 6328 determines the cut length for each run. Proceed to Process Step 6332, Return Void. Process Step 6332 returns the modified List<CutGroupPackerRun>list, passed in by reference and ends Process Step 6300.

From Process Step 6300, FIG. 3B, proceed to Process Step 6108, CheckRunResult. Process Step 6108 validates the results. Proceed to Process Step 6112, PickBestRun. In Process Step 6112, the least cost result wins. Proceed to Process Step 6116, FinalizeOutput. Process Step 6116 formats the output so that it can be used by the calculator. Proceed to Process Step 6120, ReturnIPackOutput. Process Step 6120 returns the optimal collection of packed cuts in a form that can be understood by the calculator and ends Process Step 6100.

From Process Step 6100, FIG. 3A, proceed to Process Step 6020, Return IPackOutput. Process Step 6020 returns the most optimal packing run and ends CutGroupPacIRunner.Pack( ).

FIG. 4 shows diagrammatically the operation of the packer on a sample floor material roll. Rolled sheet 9000 is shown packed with first full width cut 9004, second full width cut 9008 and first packed cuts 9012 and second packed cuts 9016. Material length of rolled sheet 9000 is initially set at the height of the initial cut and is added to as required by each successive cut. Cuts with full material width such as cut 9004 and cut 9008 are added first, then remaining cuts are sorted and fit into the sheet configuration one at a time.

Figure 4A:
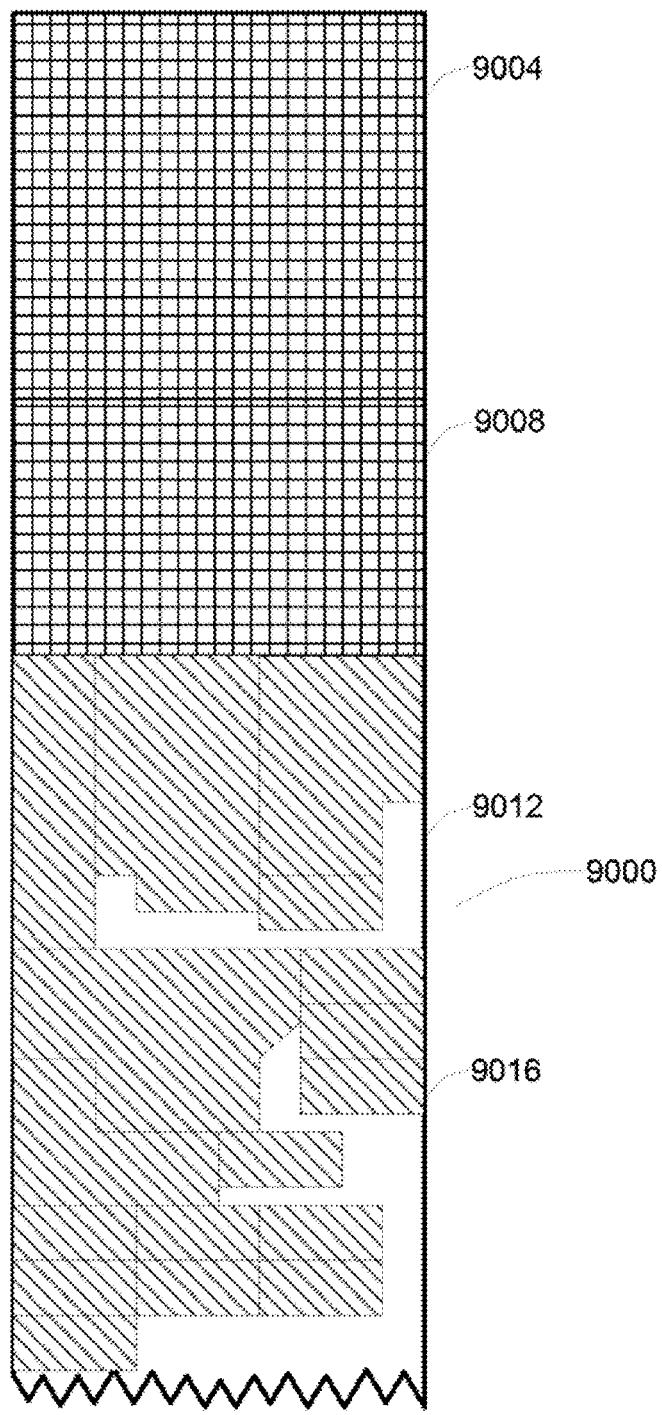
FIG. 4A through 4E is a diagrammatic drawing showing the packer operation according to a preferred embodiment of the invention.
Figure 4B:
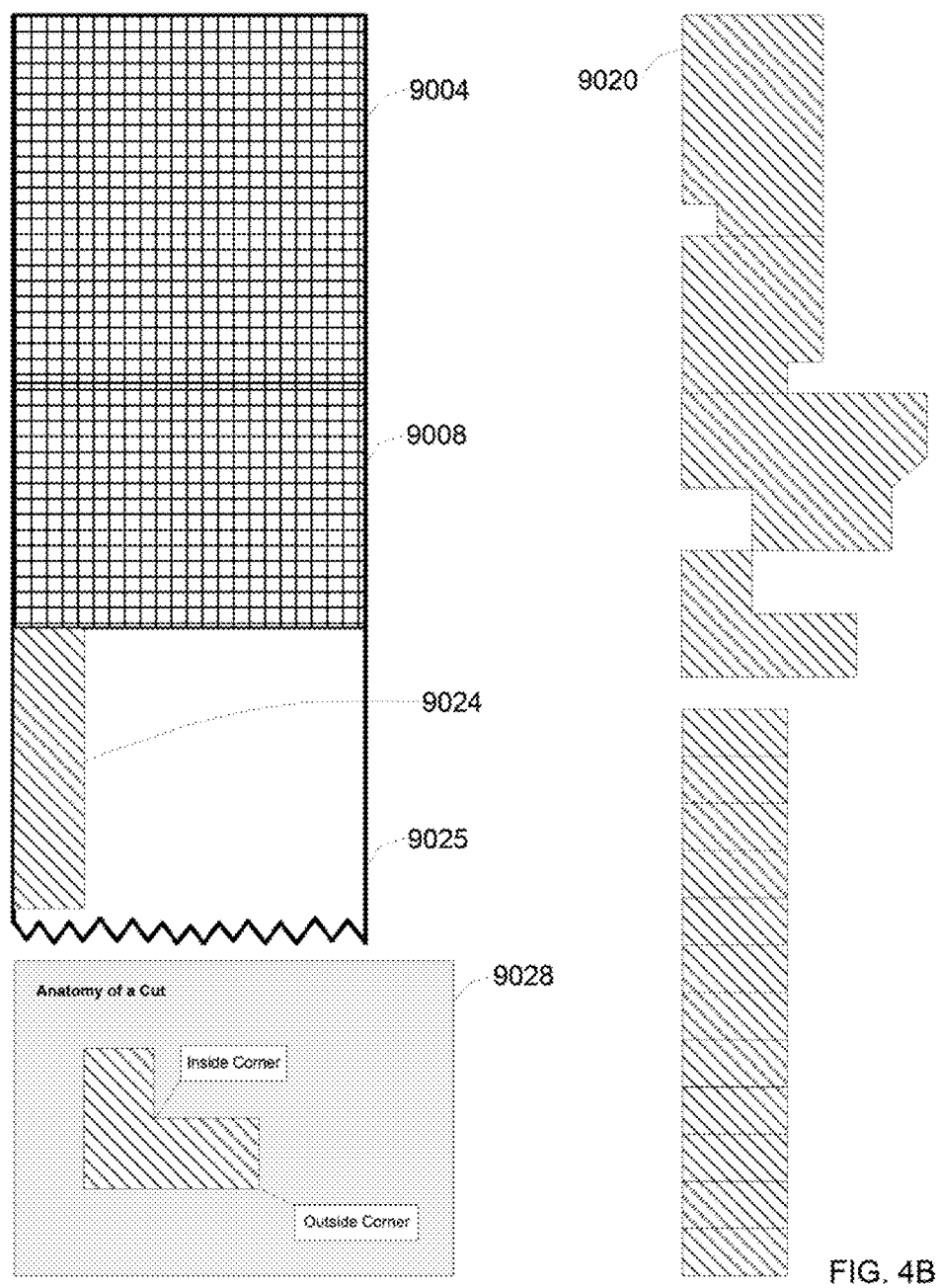

FIG. 4B shows required pieces 9020 that require packing on rolled sheet 9000. A sample remainder piece 9024 characterized by metadata describing the remainder's points so that the points of the remainder can be compared against the points of the cuts. On remainder piece 9024, the top left corner of the remainder matches that of the cut. That is, they are both outside corners and their incoming and outgoing directions are identical. It is deemed a fit and the cut is positioned on the material. Remaining space 9025 is then tested against the required pieces 9020 in an iterative process to determine the optimal packing and to minimize waste.

Figure 4C:
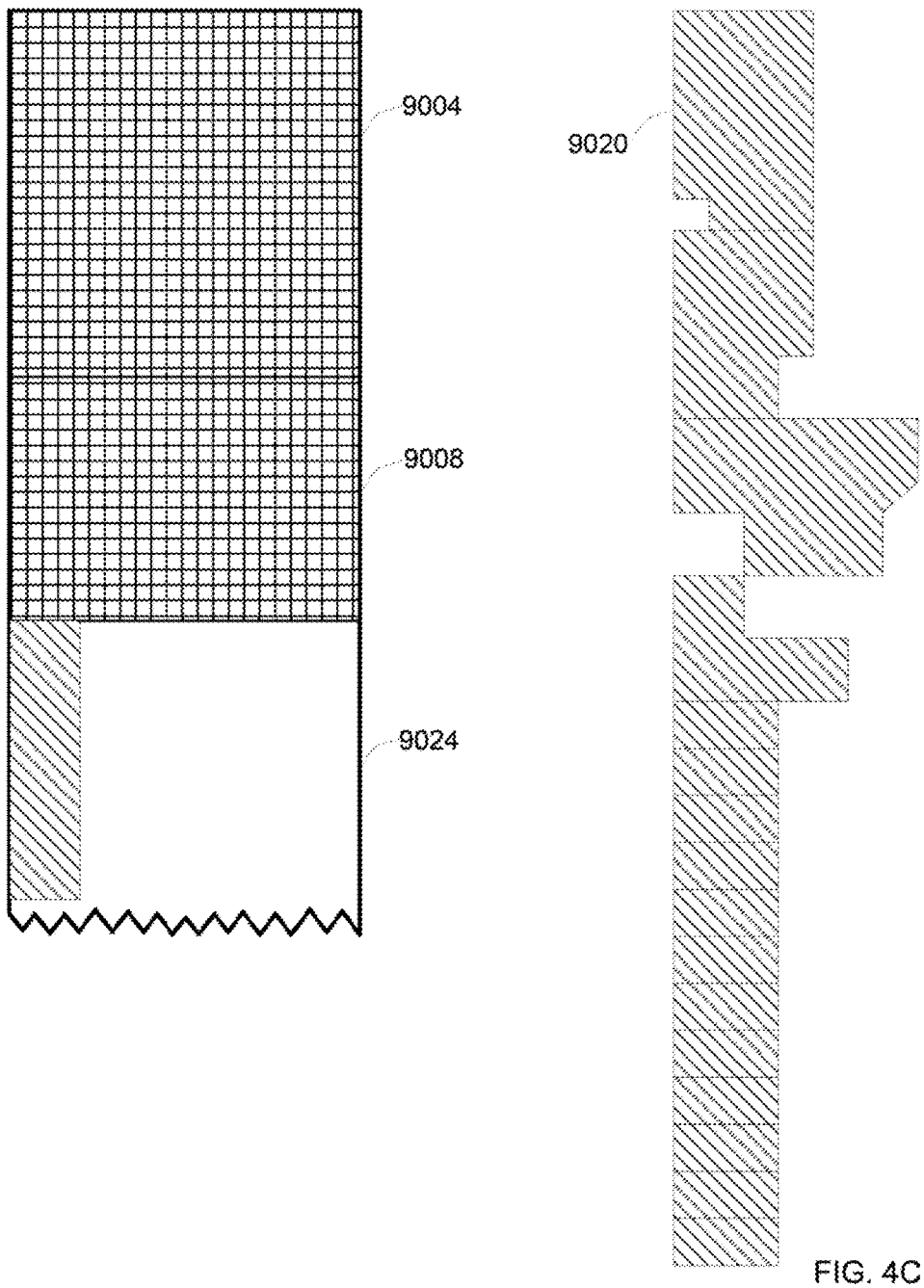
Figure 4D:
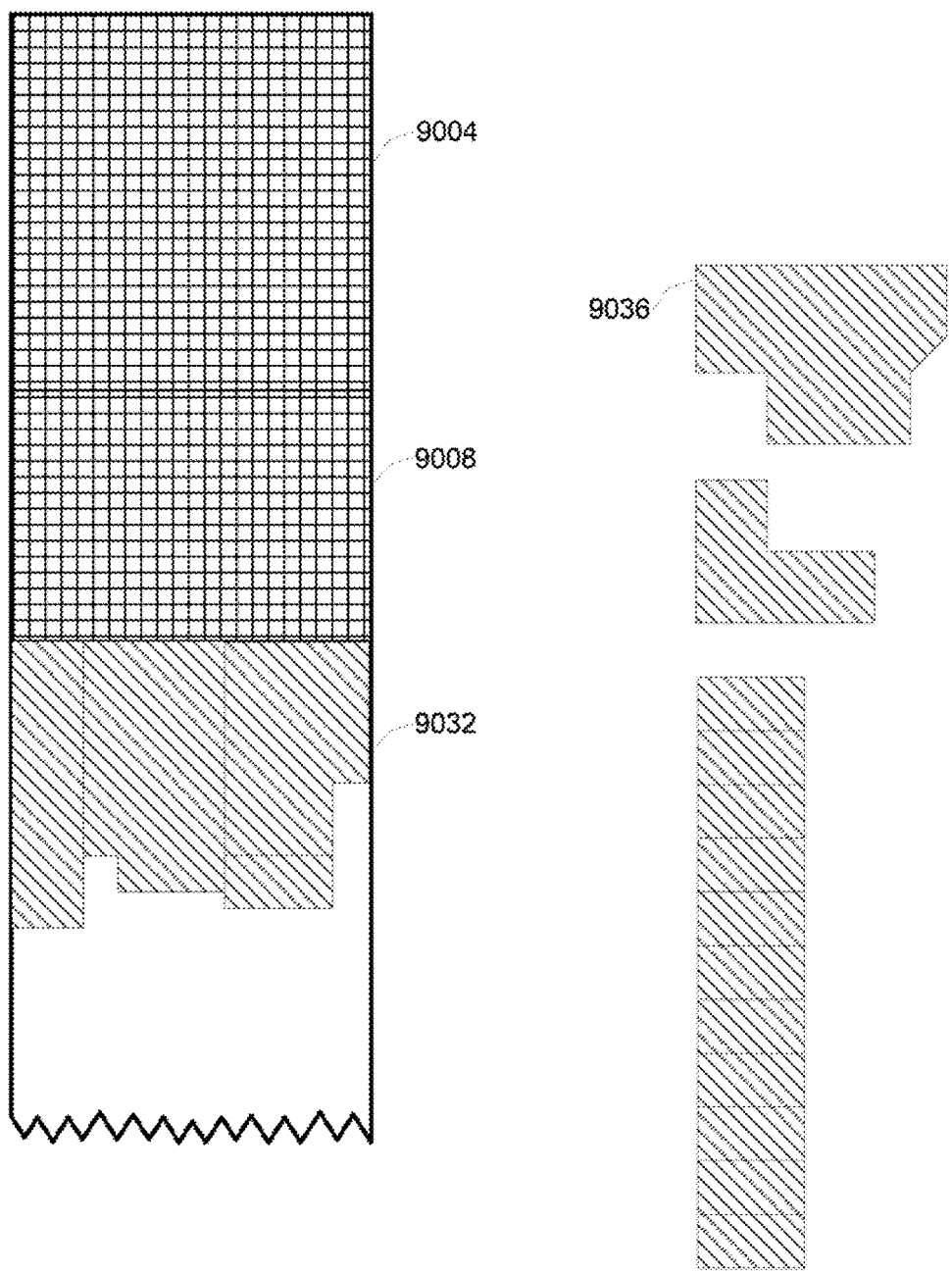
Figure 4E:
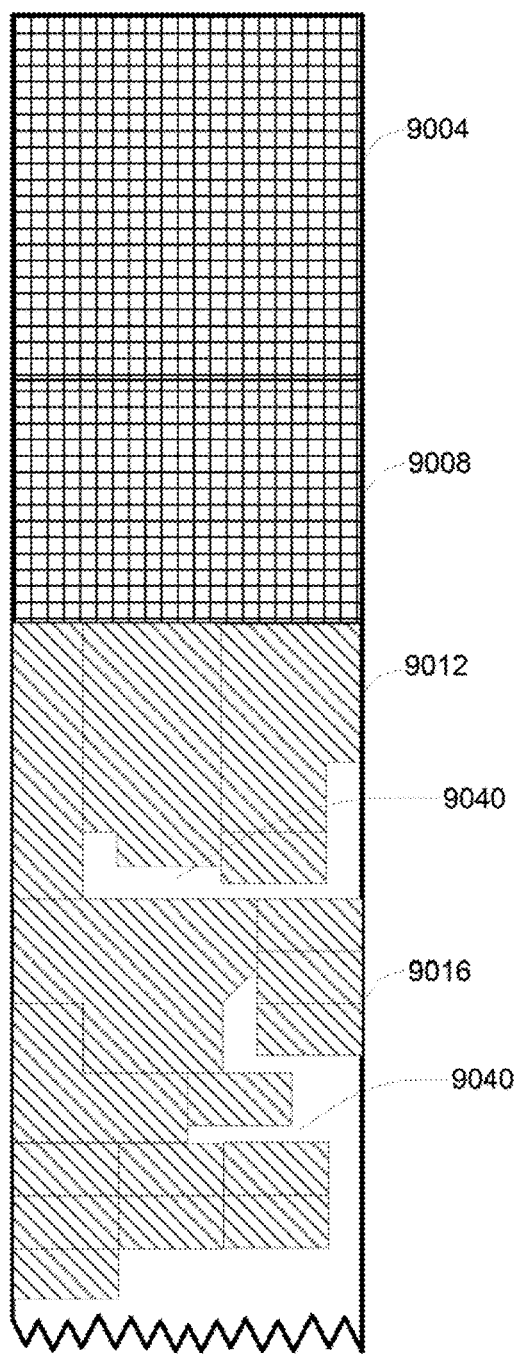

FIG. 4C shows that after adding remainder piece 9024 from FIG. 4B, the material is lengthened to accommodate remainder piece 9024 for later testing of the remaining cuts and sorting against the remainder. Each of the required pieces 9020 will be tested against each of the corners of the material's remainder starting with the upper left most outside corner. As each required piece is fit into the rolled sheet 9000, as shown in packed pieces 9032, the material is lengthened to accommodate the largest cut according to the current sort order. Metadata for the remainder is generated after each cut is packed because the geometry has changed. FIG. 4D shows insertion of several pieces as packed pieces 9032 with reduced required pieces 9036. FIG. 4E shows how as the process is repeated, all cuts are packed. Gaps 9040 may remain since the packer uses corner logic to arrange the pieces. In a preferred embodiment, these gaps are an acceptable tradeoff between efficiency and performance. Rolled Sheet 9000 is lengthened appropriately to include final packed pieces 9016 into the sheet.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the later filed claims.

The invention claimed is:

1. A computerized method for optimizing floor coverings comprising:
   a. Receiving user input by a user from an input device representative of a construction project including user selected floor covering characteristics of a plurality of floor covering materials, said floor covering material having a predetermined width on a roll;

b. Providing floor plans through a computer to said user representative of said construction project including optional configurations of said floor plans;

c. Receiving user input by a user from an input device for selection from a plurality of said floor plans and floor plan options and creating data points representative of one of said floor plans and said floor plan options;

d. Merging said floor plan and floor plan options into a set of data points representative of a final plan set;

e. Calculating optimal cuts for said final plan set;

f. Arranging said floor covering material from said optimal cuts onto stock floor covering rolls for optimal use of said floor covering;

g. Determining optimal layout of cuts on a roll by iteratively testing a plurality of cut and packing configurations into said selected floor plan;

h. Deriving contiguity data from surface areas representative of said selected floor plan;

i. Deriving surface quantities from said contiguity data for floor materials;

j. Optimizing price and material usage of floor materials for user selected criteria pertaining to said floor materials based on said derived contiguity data, pre-determined rules and user selected seam criteria pertaining to head and side cross seams.

2. The computerized method for optimizing floor coverings as claimed in claim 1 further comprising the step of minimizing seam locations based on floor geometries of said plan.

3. The computerized method for optimizing floor coverings as claimed in claim 2 wherein said geometries include determining door position and room openings in said floor plan.

4. The computerized method for optimizing floor coverings as claimed in claim 1 further comprising the step of weighting traffic values for said plans.

5. A system for optimizing floor coverings based on end user interaction comprising:

a. An input device for selecting construction plans representative of a construction project including user selected floor covering characteristics of a plurality of floor covering materials, said floor covering material having a predetermined width on a roll;

b. An output device for presenting information from a processor and data storage;

c. Said processor merges selected user floor plan choices with optional room choices to create a set of data points representative of the geography of said floor plan;

d. Said processor calculates optimal cuts for said set of data points;

e. Said processor arranges said floor covering material from said optimal cuts onto stock floor covering rolls for optimal use of said floor covering;

f. Said processor determines optimal layout of cuts on a roll by iteratively testing a plurality of cut and packing configurations into said floor plan; and g. Said processor derives surface area quantities from said packing configurations for floor materials.

6. The system for optimizing floor coverings based on end user interaction as claimed in claim 5 further comprising presentation through said output of updated pricing information responsive to user changes to said construction plans.

7. The system for optimizing floor coverings based on end user interaction as claimed in claim 5 further comprising weighting floor traffic for said construction plans.

8. The system for optimizing floor coverings based on end user interaction as claimed in claim 5 further comprising analysis of corner locations on said cuts.

9. The system for optimizing floor coverings based on end user interaction as claimed in claim 5 further comprising minimizing seam locations on said cuts.

10. A method for optimizing floor coverings based on end user interaction comprising:

a. Receiving input from an end user through an input device for selecting construction plans representative of a construction project including user selected floor covering, characteristics of a plurality of floor covering materials and presenting output to said end user;

b. Merging selected user floor plan choices with optional room choices in a processor to create a set of data points representative of the geography of said floor plan;

c. Calculating the optimal cuts for said set of data points;

d. Arranging said floor covering material from said optimal cuts onto stock floor covering rolls for optimal use of said floor covering;

e. Determining optimal layout of cuts on a roll by iteratively testing a plurality of cut and packing configurations into said selected floor plan; and f. Deriving surface quantities for floor materials.

11. The method for optimizing floor coverings based on end user interaction as claimed in claim 10 further comprising the step of presenting updated pricing information responsive to user changes to said plans.

12. The method for optimizing floor coverings based on end user interaction as claimed in claim 10 further comprising the step of analyzing corner locations on said optimal cuts.

13. The method for optimizing floor coverings based on end user interaction as claimed in claim 10 further comprising the step of minimizing head and side cross seam locations on said optimal cuts.

14. The method for optimizing floor coverings based on end user interaction as claimed in claim 10 further comprising the step of determining door position and room openings in said floor plans.

* * * * *